US010485094B1

(12) United States Patent
Isohätälä et al.

(10) Patent No.: US 10,485,094 B1
(45) Date of Patent: Nov. 19, 2019

(54) MULTILAYER STRUCTURE WITH EMBEDDED SENSING FUNCTIONALITIES AND RELATED METHOD OF MANUFACTURE

(71) Applicant: TactoTek Oy, Oulunsalo (FI)

(72) Inventors: Anne Isohätälä, Oulunsalo (FI); Hasse Sinivaara, Oulunsalo (FI); Heikki Tuovinen, Oulunsalo (FI); Ville Wallenius, Oulunsalo (FI); Vinski Bräysy, Oulunsalo (FI); Tomi Simula, Oulunsalo (FI); Mikko Heikkinen, Oulunsalo (FI); Minna Pirkonen, Oulunsalo (FI); Tuukka Junkkari, Oulunsalo (FI); Jarmo Sääski, Oulunsalo (FI); Janne Asikkala, Oulunsalo (FI); Antti Keränen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/113,198

(22) Filed: Aug. 27, 2018

(51) Int. Cl.
| G01R 27/26 | (2006.01) |
| H05K 1/02 | (2006.01) |
| H05K 1/18 | (2006.01) |
| H05K 3/00 | (2006.01) |
| H05K 1/16 | (2006.01) |
| G06F 3/044 | (2006.01) |

(52) U.S. Cl.
CPC ....... *H05K 1/0218* (2013.01); *G01R 27/2605* (2013.01); *H05K 1/186* (2013.01); *H05K 3/0014* (2013.01); *G06F 3/044* (2013.01); *G06F 2203/04104* (2013.01); *H05K 1/0259* (2013.01); *H05K 1/0266* (2013.01); *H05K 1/162* (2013.01); *H05K 1/165* (2013.01); *H05K 2201/10151* (2013.01); *H05K 2203/1327* (2013.01)

(58) Field of Classification Search
CPC .......... G06F 3/044; G06F 3/038; G06F 3/041; G09G 5/00
See application file for complete search history.

(56) References Cited

U.S. PATENT DOCUMENTS

| 6,234,031 | B1 * | 5/2001 | Suga ................... G06K 9/0002 |
| | | | 73/862.474 |
| 2007/0078316 | A1 * | 4/2007 | Hoarau ............. A61B 5/14552 |
| | | | 600/323 |
| 2015/0160754 | A1 * | 6/2015 | Wenzel .................. G06F 3/044 |
| | | | 345/174 |
| 2016/0290878 | A1 * | 10/2016 | Severinkangas ........ G01L 1/146 |
| 2017/0323130 | A1 * | 11/2017 | Dickinson ................ A61B 8/02 |

* cited by examiner

*Primary Examiner* — Minh N Tang
(74) *Attorney, Agent, or Firm* — Robert P. Michal, Esq.; Carter, DeLuca & Farrell LLP

(57) ABSTRACT

Integrated multilayer structure suitable for use in sensing applications is disclosed including at least one plastic layer, at least one film layer provided on both sides of the plastic layer. A film layer on a first side of the plastic layer includes electronics incorporating reactance sensing electronics for sensing of selected target quantities, and conversion thereof into representative electrical signals. The sensing electronics include an electrode and a connection element for connecting the electrode to control circuitry. A film layer on a second side of the plastic layer includes features including one conductive feature that is configured to shape an electromagnetic field to adapt a sensitivity or directionality the sensing response of the sensing electronics on the first side of the plastic layer.

20 Claims, 7 Drawing Sheets

MULTILAYER STRUCTURE WITH EMBEDDED SENSING FUNCTIONALITIES AND RELATED METHOD OF MANUFACTURE

FIELD OF THE INVENTION

Generally the present invention relates to electronics, associated devices, structures and methods of manufacture. In particular, however not exclusively, the present invention concerns manufacturing of multilayer structures incorporating a number of features for sensing or other purposes.

BACKGROUND

There exists a variety of different stacked assemblies and structures in the context of electronics and electronic products.

The motivation behind the integration of electronics and related products may be as diverse as the related use contexts. Size savings, weight savings, cost savings, or just efficient integration of components and associated, potentially synergetic, functionalities may be originally sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors and vehicle electronics, antennae, labels, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, lithography and inkjet printing, through a substantially additive printing process. The used substrates may be flexible and printed materials organic, which is however, not always the case.

The concept of injection molded structural electronics (IMSE) actually involves building functional devices and parts therefor in the form of a multilayer structure, which encapsulates electronic functionality and possibly other functionality.

In an IMSE process different features of desired function may be first applied to a substrate film. Then the film may be inserted in an injection molding cavity, where hot melt state material is injected upon the film or between the films in the case of several ones, thus becoming an integral part of a resulting multilayer structure.

One interesting characteristic of IMSE is also that the electronics is often, not always, manufactured into a 3D (non-planar) form in accordance with the 3D models of the overall target product, part or generally design. To achieve desired layout of electronic or other elements on a substrate and in the associated end product, the electronics may be still provided on an initially planar substrate, such as a film, using two dimensional (2D) methods of electronics assembly, whereupon the substrate, already accommodating the electronics, may be optionally subsequently formed into a desired three-dimensional, i.e. 3D, shape and subjected to overmolding, for example, by suitable plastic material that covers and embeds the underlying elements such as electronics, thus protecting and potentially also hiding the elements from the environment.

In some use scenarios, space constraints limit the amount and nature of functionality that can be integrated in multilayer structures including IMSE structures.

For example, various functional features to be integrated in a common structure may require considerable space such as installation surface to first of all accommodate the associated physical element or elements, and secondly, to simultaneously maintain necessary distance between other features in favor of e.g. reducing mutually induced or externally coupled noise and thus improving signal-to-noise ratio so that inaccurate, unreliable or otherwise less-than-optimum operation such as erroneous measurements or so-called false positives (false detections of user input) could be avoided in different applications including sensing solutions.

As there may be noisy features that cause e.g. electromagnetic disturbances to the environment while there may also be features whose proper operation is particularly sensitive to disturbances, especially the integration of these two feature types may turn out challenging. Compensating noisy environment with increased size of sensitive features obviously results in even bigger space consumption related issues. Occasionally, part of the integrated features such as electronic features should remain closer to external environment such as use environment of a concerned integral structure, whereas it would be beneficial to situate some other features closer to e.g. a host device or host structure accommodating or connecting to the multilayer structure, whereupon successfully combining such objectives may be laborious, if not impossible, especially in the context of traditional, planar and stiff electronic designs and limited space with only complex shapes available for incorporating the features.

Sometimes by certain design choices such as the use of low-noise electronics (e.g. linear LED drivers instead of switched ones) the magnitude of disturbances caused may be reduced at the cost of other factors such as energy efficiency, heat generation, battery life, reduced functionality (e.g. no LED dimming). In some scenarios, operation of multiple features intended to jointly establish a functional ensemble may further suffer from sub-optimal, such as too short, distances therebetween. In some scenarios, several electrically functional conductive features are to be superimposed, which requires the use of e.g. dielectric layers as intermediate layers. Accordingly, the number of processing phases may considerably increase, while different undesired issues such as crosstalk may still emerge and also physical layout design of the structure be ultimately subjected a multitude of annoying restrictions, also potentially negatively affecting the overall usability of the resulting product. Yet, when features are tightly packed, also accidental activation thereof and issues arising from thermal management easily become real problems.

In some use scenarios, material deflection may be desired to enhance e.g. the sensitivity of self-capacitive or force sensing solutions, whereby air cavities could be included in the structures to enable such. The use of air cavities may however cause a variety of problems such as material compatibility issues and tendency to delaminate the integrated structural layers from each other.

Further, certain materials such as metallic or other highly conductive materials cannot be utilized as overlays as they may effectively prevent correct functioning of the underlying functional features. Correspondingly, the underlying features have set limitations to aesthetic and visual properties of the structure that might well establish exterior or otherwise visible, potentially tactile, surfaces in a myriad of end products.

Still, e.g. in different sensing solutions, electric, magnetic or generally electromagnetic fields may be generated and measured to detect selected target quantities and qualities. However, controllability of the strength, dimensions, shape and alignment of such fields may remain poor, which negatively affects also spatial sensing resolution and achieved, effective signal-to-noise ratio, for instance. Shielding from external electrical disturbances or different physical or chemical phenomena may further turn out challenging. Further, effective power distribution has in many scenarios caused trouble due to a limited conductivity of e.g. additively manufactured conductor materials.

Still further, in some occasions it has been found tricky to include several conductive and e.g. galvanically connected layers, or generally features, in a common structure as accurate positioning and alignment of the concerned features themselves or required connection elements is difficult and the obtained quality of connection, such as electrical connection, between the multiple layers may remain somewhat sub-optimal.

SUMMARY

The objective of the present invention is to at least alleviate one or more of the above drawbacks associated with the existing solutions in the context of integral multilayer structures and functional elements or features such as electronics embedded therein.

The objective is achieved with various embodiments of a multilayer structure and related method of manufacture in accordance with the present invention.

According to one embodiment of the present invention, an integrated multilayer structure suitable for use in sensing applications, optionally in touch, proximity or specifically gesture, force, pressure, strain, substance, such as fluid, surface level or flow sensing, comprises:

at least one plastic layer, comprising e.g. a molded or casted layer, optionally comprising electrically substantially insulating material, having a first and an opposing second side;

at least one, optionally plastic, film layer provided on both first and second sides of the at least one plastic layer, e.g. one or two film layers on each side;

said at least one film layer on the first side of the at least one plastic layer comprising electronics incorporating advantageously reactance sensing electronics for sensing, optionally capacitive such as projected capacitance and/or inductive sensing, of one or more selected target quantities or specifically, qualities, optionally indicative of touch or proximity of an external object relative to the structure, and conversion thereof into representative electrical signals, said sensing electronics for reactance sensing comprising at least an electrode and a preferably galvanic connection element for connecting the electrode to an associated control circuitry preferably driving the at least one electrode, said structure optionally hosting at least part of the control circuitry; and said at least one film layer on the second side of the at least one plastic layer comprising one or more features including at least one (electrically) conductive feature, said one or more features being configured to adapt the sensing response, optionally sensitivity and/or directionality, of the sensing electronics on the first side of the at least one plastic layer.

In various embodiments, the at least one film layer on the first side of the at least one plastic layer is made of or at least comprises electrically insulating material. It may comprise e.g. plastic such as thermoplastic film and/or various other films or materials as discussed hereinafter. Yet, it may include electrically conductive material. Further, it may host insulating and/or conductive materials on either or both surfaces thereof e.g. in the form of one or more coatings, printed or otherwise arranged features optionally additively produced thereon, transferred (e.g. tape-based) features, laminated further films, mounted features, etc.

In various supplementary or alternative embodiments, the sensing electronics comprises one or more elements, such as electronic components, manufactured, optionally printed, deposited, coated, and/or mounted, on said at least one film layer optionally on the first side of the at least one plastic layer.

In various supplementary or alternative embodiments, the at least one electrode of the sensing electronics defines an electrode pattern the elements of which being provided in one or more layers on one or opposing two sides of said at least one film layer on the first side of the at least one plastic layer.

In various related embodiments, the pattern comprises a mutual capacitance sensing pattern of a plurality of transmitter and receiver electrodes, or a self-capacitance sensing pattern of a plurality of sensing electrodes and optionally of a reference (pattern).

In various supplementary or alternative embodiments, the at least one film layer comprises a first film on the first side of the at least one plastic layer and a second film on the second side of the at least one plastic layer.

In various supplementary or alternative embodiments, the structure comprises a film, first section of which defines at least portion of said at least one film layer on the first side of the at least one plastic layer and second section of which defines at least portion of said at least one film layer on the second side of the at least one plastic layer, wherein the first and second sections are connected by a third section extending between the two, said third section optionally hosting one or more preferably printed conductors thereon extending between said first and second sections to electrically connect them.

In various supplementary or alternative embodiments, the one or more features comprise at least one electrically conductive or insulating functional element locally defined by the material of a film of said at least one film layer, such as a patterned shape, on the second side of the at least one molded plastic layer.

In various supplementary or alternative embodiments, the one or more features comprise conductive material constituting at least portion of a film of said at least one film layer on the second side of the at least one plastic layer, wherein the film is optionally of substantially uniform or non-uniform composition.

In various supplementary or alternative embodiments, the one or more features comprise at least one electrically and/or thermally conductive or insulating element defined by additional conductive or insulating material provided, optionally printed or coated, on a film of said at least one film layer on the second side of the at least one plastic layer, at least one element of said at least one element being optionally defined at least on a side of a film of said at least one film layer on the second side of the at least one plastic layer that faces the at least one plastic layer or on an opposite side facing away from the at least one plastic layer.

In a related embodiment, the element extends locally on the film and defines e.g. a pattern thereon. The element may alternatively extend over a major portion of or substantially whole surface of the film on at least one side thereof, optionally as a coating such as metallic coating or plating layer.

In various supplementary or alternative embodiments, e.g. the aforementioned one or more features of the structure comprise colored, conductive material, optionally pigmented or dyed paint or ink, said material optionally comprising silver, salt, noble metal, carbon nanotube, carbon nanobud, or conductive polymer, on a film of said at least one film layer on the second side of the at least one molded plastic layer, said material being optionally configured to define a graphical feature such as a symbol, number, character, picture, area or button shape, geometric shape or text of decorative and/or informative nature.

In various supplementary or alternative embodiments, e.g. the aforementioned one or more features of the structure comprise at least one feature positioned adjacent a predefined sensing area or sensing volume established by at least one electrode and a further electrode or reference (e.g. ground) pattern provided in the structure, and/or positioned at least partially superimposed over a conductive trace of the sensing electronics, said at least one feature defining at least one functional element selected from the group consisting of:

a. an electromagnetic shield, such as EMI or ESD shield, for shielding the sensing area, sensing volume or said trace from external or internal electromagnetic disturbances or interference, wherein the shield is optionally floating, earthed or connected to circuit ground; and b. electromagnetic or electric field adjuster for adjusting, optionally directional, sensitivity of the sensing volume optionally actively through dynamically directing electrical current or potential thereto as controlled by the control electronics.

In various supplementary or alternative embodiments, the sensing electronics and said one or more features at least partially define one or more sensing areas or volumes on both sides of the at least one plastic layer and said structure further comprises an intermediate film within the at least one molded plastic layer, said intermediate film being at least partially made of or provided with conductive material defining an electromagnetic shield or a grounding layer to reduce mutual electromagnetic interference between the sensing functions of both sides.

In various supplementary or alternative embodiments, e.g. the aforementioned one or more features of the structure define at least one element selected from the group consisting of: electrode or electrode pattern configured to establish a mutual capacitance sensing arrangement with the at least one electrode of the sensing electronics, electrode or electrode pattern on a side of a film of said at least one film layer on the second side of the at least one plastic layer that faces the at least one plastic layer and configured to establish a mutual capacitance sensing arrangement with the at least one electrode of the sensing electronics, touch or contactless sensing region, NCVM coating, electroless plating based coating, PVD coating, capacitively coupled electromagnetic or electric field adjuster, parasitic coupling based sensing feature, reference electrode, actively or passively coupled reference plate, ground electrode, and floating ground, earthed, or circuit ground connected ground electrode.

In various supplementary or alternative embodiments, the at least one plastic layer comprises a volume of elastic material, optionally of relative permittivity equal to or exceeding a selected threshold value, such as about or more exactly 5, and/or substantially exceeding the relative permittivity of other, e.g. primary, material of the at least one plastic layer, said elastic volume being provided locally upon the at least one electrode of the sensing electronics and/or below a predefined sensing region (and e.g. electrode thereof) on the at least one film layer on the second side of the at least one plastic layer, said volume being preferably configured to compress responsive to an external force subjected thereto through said at least one film layer.

In various supplementary or alternative embodiments, the structure comprises a galvanic connection element, such as conductive spring, contact stud or a flexible connecting member, between the sensing electronics and said one or more features, optionally provided by at least one conductive element extending through the molded plastic layer or at the edge or perimeter of the structure.

In various supplementary or alternative embodiments, the structure comprises at least one protective and/or decorative overlay layer upon the at least one film layer on the second side of the at least one plastic layer, wherein the overlay layer comprises at least one material selected from the group consisting of: veneer, wood, textile, fabric, biological natural material, molded material, injection molded material, and plastics.

According to an embodiment, a method for manufacturing an integrated multilayer structure for sensing applications, comprises:

obtaining at least one, optionally plastic, film;

arranging said at least one film, optionally a first film of said at least one film, with advantageously reactance sensing electronics for sensing of one or more selected target quantities and/or qualities, and conversion thereof into representative electrical signals, said sensing electronics comprising at least one electrode and a preferably galvanic connection element connecting it to an associated control circuitry preferably driving (controlling) the at least one electrode, optionally further providing said at least one film with at least portion of the control circuitry such as an integrated control circuit;

arranging said at least one film, optionally a second film of said at least one film, with one or more features including at least one conductive feature, said one or more features being configured to adapt the sensing response, optionally sensitivity and/or directionality, of the sensing electronics, wherein arranging optionally comprises patterning said at least one film and/or adding material thereon preferably by printed electronics technology or plating or other form of coating; and arranging, optionally through molding or casting, and configuring at least one advantageously plastic layer, preferably comprising electrically substantially insulating material, relative to the at least one film so that the at least one plastic layer defines a preferably essentially integrated, intermediate layer between the sensing electronics and the sensing response—adapting one or more features hosted by said at least one film, wherein at least one film of said at least one film is optionally formed to exhibit a selected three-dimensional shape further optionally subsequent to providing at least part of the sensing electronics or said one or more features thereto.

Various considerations provided herein concerning the embodiments of the multilayer structure may be flexibly applied to the embodiments of a manufacturing method mutatis mutandis, and vice versa, as being appreciated by a skilled person. Yet, various embodiments and related features may be flexibly combined by a person skilled in the art to come up with preferred combinations of features generally disclosed herein.

The utility of the present invention arises from a plurality of issues depending on the embodiment.

Generally, it is made possible, by different embodiments of the present invention to design and produce tailored functional ensembles that flexibly fit different physical host structures with associated characterizing forms, shapes and materials.

As the suggested multilayer structure may contain several functional layers, each provided with selected functional features and the layers/features advantageously having an optimum spacing and optionally connection such as electrical connection therebetween, a great variety of features may be effectively integrated together e.g. on either or both sides of included one or more film layers that may, in turn, reside on both sides of intermediate one or more layers such as molded, casted or otherwise produced plastics-containing or other layers, while operation of each feature can be still cleverly optimized in terms of multiple criteria such as (reduced) mutual or external noise coupling, or SNR (signal-to-noise ratio), noise tolerance, detection sensitivity, detection directionality, aesthetical, visual and optical considerations, item dimensions, weight, thermal properties and heat management, etc.

In various embodiments, several features producing different functionality or effect may be provided on different layers as overlaid to optionally produce a combined or synergetic effect, such as sensing function combined with aesthetic, informative (e.g. guiding/indicative) or other visual or optical effect.

For example, embodiments using two films or film layers on both sides or generally at different locations of a part, device or other type of a multilayer structure to accommodate electrical and other, occasionally multi-purpose or joint, features may help alleviating many of the issues associated with single-layer solutions including but not in any manner limited to e.g.
- switched LEDs, data bus traces and power circuitry, or other features considered noisy, which may be now placed further away from more sensitive features such as capacitive sensors if they are provided e.g. on a different film layer;
- noise currents, which cannot efficiently couple to the other film layer when the ground planes have e.g. a star connection and no direct flow through. Current loops will not pass through the second film;
- direct coupling of noise through slightly conductive materials (such as many black inks, mineral-filled inks tend to be), which can be practically eliminated. This enables a wider variety of materials to be used for different purposes, including e.g. decoration and field shaping;
- aesthetic or visual concerns: multi-layer solution enables using e.g. functionalized decorative graphics elements also e.g. as capacitive sensors or antenna radiators. In addition, e.g. mutual capacitive sensors can be implemented so that they are immune to undesired activation e.g. via backside or other intended passive side of the structure. For instance, a TX hatch can be provided on a predefined rear film, while the solution is still highly sensitive to touch on the front (intended activation) surface or direction as desired RX patterns can be provided on the respective surface(s);
- false operation/detections in general: having an extensive shield printed or otherwise produced so that it is open only on desired sensing areas where touch sensitivity is needed, can be used to effectively mask "ghost" activations and false detections on sensing circuitry such as electrodes or traces via the respective side. This shield provided e.g. on a front side or user input side of the structure can also be used as a "driven shield", making the system potentially highly immune to false activations from e.g. water as the system ground can be largely masked from coupling through water;
- space concerns and dimensional constraints: producing (printing, dispensing, etc.) materials with different electrical or magnetic parameters on one, e.g. front, film can be used for field shaping in order to e.g. make tightly-spaced sensing features such as touch-sensitive areas defining touch buttons appear further apart from a signal point of view, or the produced structures can absorb fields to e.g. limit EMI emitted by the structure; and/or
- optimal functioning and manufacturing challenges: utilization of e.g. shielding features such as printed features may become more meaningful or practical when the shields can "flow over" structures to be shielded. Having both the shield and traces to protect in a single layer is not as efficient as having them over each other without having to e.g. print dielectrics between wiring layers and shield, potentially ground loading capacitive or other sensors excessively.

In various sensing scenarios and embodiments, the present invention may offer improved sensitivity through provision of features such as printed or otherwise produced electrodes on different, superimposed layers such as films of the stacked structure, preferably having deformable, or "soft", material, optionally associated with high relative permittivity, in between to translate smaller external force-induced (e.g. touch-induced) deformation of the structure into a larger effect in the sensed mutual capacitance, or generally, sensed quantity. Use of often rather problematic gaseous or specifically, air-filled cavities to enable sufficient material deformation, may be avoided or reduced.

In various embodiments, reactive sensing techniques suggested herein such as capacitive sensing may indeed be provided by the multilayer structure even if it generally contains electrically highly conductive, such as metallic, surfaces, while further omitting the need for internal gas or specifically air-filled cavities that may cause undesired delamination of the structure. Effectively, e.g. touch-through-metal type solutions may be provided. Yet, having regard to manufacturing, the multilayer structures in accordance with various embodiments of the present invention may be established substantially even by a single manufacturing process instead of complex combinations of various mandatory methods and post processing steps. Further, some materials such as aluminum is prone to permanent deformation if a thin layer thereof is applied—in the material stack of the present invention the stack may be thus configured to act as a 'spring' to prevent permanent deformation and by that prevent losing desired performance aspects. Generally, multiple layers of the multilayer structure may be manufacturing using various lamination (heat, pressure, adhesive, chemical, physical, etc.), molding (e.g. multi-shot) and/or printing (e.g. printed electronics printing methods) techniques.

In various embodiments, application of galvanically unconnected elements provided on one layer may be configured to shape the electromagnetic field in favor of improved operation such as sensitivity and directionality as well as reduced noise sensitivity, established by the electronics such as sensing electronics provided remotely on another layer. Similar construction could be alternatively applied for provision of capacitively fed antennae to provide enhanced efficiency and e.g. facilitated impedance matching between the feeding and radiating elements.

In various embodiments, a touch or gesture (contactless) sensing function may be provided by the suggested structure, or specifically e.g. a panel, through implementing multiple superimposed features such as electrode patterns or generally, multilayer or multi-surface electrical layout, therein. For instance, the patterns may be provided on different, opposing surfaces of a common element such as a film, and/or on multiple elements such as films or other layers. Different functionalities can be flexibly overlaid to produce essentially separate or synergetic effect. For instance, a multi-touch sensing arrangement could be superimposed with a lighting solution such as a number of LEDs and/or light directing structures such as graphics or other optical forms, considering e.g. illumination or visualization of sensing area. One film or layer could implement at least one function (e.g. using both sides/surfaces of the layer for the purpose) whereas another film or layer could be harnessed into another, potentially synergetic, purpose.

Flexibility offered by multi-surface (population) solutions and feature overlaying in general may further translate into a reduced use of support features such as dielectric layers, which might still suffer from defects such as crosstalk challenges and/or require e.g. non-conductive ink traces to overlap in undesired locations from the standpoint of optimum electrical design. Omitting unnecessary features or specifically, layers such as dielectric layers from the overall structure will be advantageous to the layout design in terms of generally simplicity, but also having regard to electrical susceptibility, performance and cost. On the other hand, multi-layer and multi-surface designs enable, when beneficial, also more efficient system level or application level integration, which may be in practice realized through e.g. mutually compacted positioning of features such as electronic features. For example, system electronics such as controllers or integrated circuits may be positioned closer to sensing areas.

In various embodiments, the multilayer structure may incorporate a number of functional coatings (on the exterior of the structure and/or as embedded on some internal surface(s)/interface(s)) provided in accordance with the present invention. Such coatings may find use in various use contexts such as different lighting applications in addition to or instead of sensing. The functionalities may further include e.g. thermal management (the coating may comprise material that has a selected thermal conductivity for effective cooling of the structure or included features, or high enough thermal insulation capability, for example), power distribution (e.g. sufficiently high electrical conductivity), electrical shielding (e.g. conductivity or insulation capability), and/or light management (e.g. optical transmissivity, reflectance at concerned wavelengths such as visible light). Yet, the coatings may still have decorative/aesthetic and/or informative visual function.

In various embodiments, functional materials such as printable materials or generally pigmented or colored inks or paints may be applied besides in providing e.g. optical or electrical transmissivity or conductivity, in the provision of aesthetic, informative or other visual features such as symbolic or geometric shapes. For the purpose, conductive ink or paint may be colored according to desired color preferences, for instance. Accordingly, underlying non-visual features may be masked from the user without a need to provide additional masking features or positioning the underlying features out of sight. Reducing the number of layers may in turn advantageously render the target multilayer structure simpler, which may facilitate and step up their manufacturing.

As already alluded to hereinbefore, in various embodiments, the present invention may be exploited in providing effective trace shielding for sensing, such as capacitive sensing, and other purposes. A shielding or specifically, e.g. a grounding element may be provided from electrically conductive layer of material using, among other possibilities, a (printed) conductive hatch (cost optimized fill ratio per target) or (printed) layer of conductive ink, which may also have decorative or other visual function in the multilayer structure. Accordingly, as noise problems and false coupling—causing ghost detections can be reduced, the size of the actual sensing features may be kept moderate, for instance, which spares space to other uses or just for keeping the structure compact.

In various embodiments, several layers of the structure may be established from a single element such as a film that is folded or generally bent, to form such layers while optionally still remaining in one piece, which facilitates and enables providing also the desired connectivity such as electrical, optical and/or thermal conductivity between the layers by connective features such as conductor traces provided upon the film and extending from a layer to another.

In various embodiments, multilayer structures having multiple simultaneously operable touch-sensitive sides or generally, sensing surfaces, layers, regions or directions, may be arranged so that mutual interference between the associated sensing functionalities is reduced and remains small. This may be obtained by a shielding or specifically, grounding, feature positioned between the sensing functionalities, such as electrodes, and optionally provided on intermediate substrate layer by printed electronics, for example.

Generally, different embodiments of a manufacturing method considered herein, notwithstanding their uniqueness and benefits over the prior art, are still somewhat straightforward to comprehend and take into use, and do not necessitate adopting e.g. complex trial stage manufacturing technologies for providing the selected, desired features in the multilayer structure for sensing or other purposes.

Forming of the film(s) to a desired 3D shape e.g. after provision of features such as conductors or further electronics thereon while the substrate film(s) were still at least in places substantially planar, may additionally reduce or obviate a need for potentially tedious and error prone 3D assembly of electronics on substrate films or other layers.

The obtained multilayer structures may be used to establish a desired device or module in different host elements, host structures, host devices or host entities with reference to e.g. vehicles or specifically (in-)vehicle electronics, lighting devices including vehicle lighting, user interfaces in vehicles and elsewhere, dashboard electronics, in-vehicle entertainment devices and systems, vehicle interior (e.g. door, dash, center console, floor, wall, roof) or exterior panels, intelligent garment (e.g. shirt, jacket, or trousers, or e.g. a compression garment), other piece of wearable electronics (e.g. wristop device, headwear, or footwear), personal communications devices (e.g. smartphone, phablet or tablet) and other electronics or electronics-containing items or systems. The integration level of the obtained structure may be high and desired dimensions such as the thickness thereof small.

The used film(s) and generally material layers may contain graphics and other visually and/or tactilely detectable features thereon, whereupon the films/layers may have aesthetic (decorative) and/or informative function in addition to hosting and protecting e.g. electronics for sensing and/or other uses. The film(s)/layer(s) may be translucent or opaque at least in places. They may exhibit a desired color or comprise portions exhibiting a desired color to the corresponding portions of the structure. The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces. Exterior film(s) of the multilayer structure may be configured to establish at least a portion of outer and/or inner surface of the associated host product or host structure.

Various visible or visual features such as graphical patterns, indicators or coloring may be provided underneath the exterior surface of the structure so that the features remain isolated and thus protected from environmental effects at least by the thickness of the hosting substrate film and optionally of e.g. a molded or casted layer depending on which side of and on which film the concerned feature was provided relative to the particular environmental threat. Accordingly, different impacts, rubbing, chemicals, etc. that could easily damage e.g. painted, printed, mounted or otherwise provided surface features do not affect or reach the features. The material layers such as the ones defined by substrate or other films may be easily manufactured or processed, optionally cut, into a desired shape with necessary characteristics such as holes or notches for selectively exposing the underlying features such as the molded material.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated or being clear to a person skilled in the art.

When "different" or "various" embodiments of the multilayer structure, related method of manufacture, or features included therein are referred to in this text, the embodiments are to be considered mutually supplementary and may thus be realized also in common embodiments, unless being otherwise explicitly stated or be otherwise clear to a person skilled in the art that the concerned solutions are mutually clearly exclusive, alternative solutions for implementing the very same feature of the overall solution.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
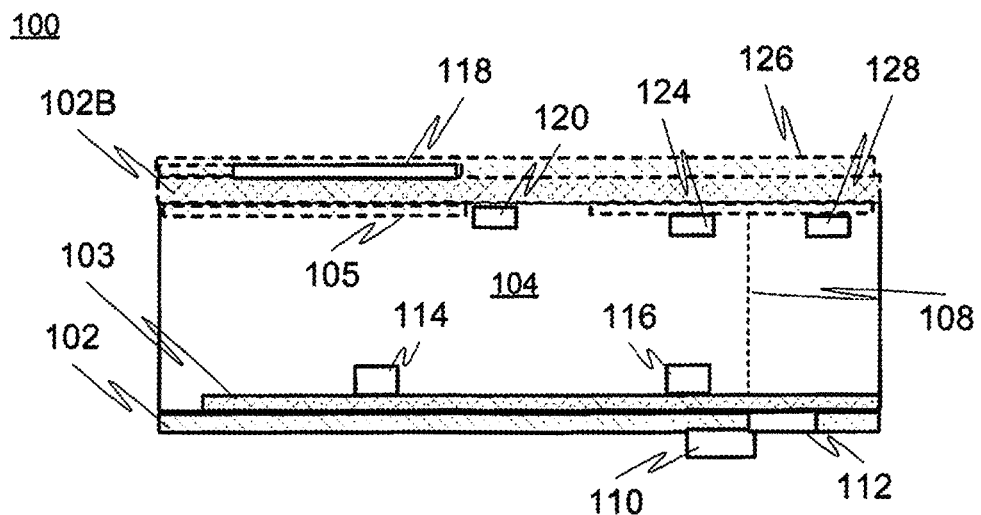
FIG. 1 illustrates an embodiment of a multilayer structure in accordance with the present invention.

FIG. 1 illustrates, via a (cross-sectional) side view, an embodiment 100 of a multilayer structure in accordance with the present invention. The multilayer structure 100 may establish an end product per se, e.g. an electronic device, or be disposed in or at least connected to a host such as a host device, host system or host structure as an aggregate part or module, for example. It 100 may comprise a number of further elements or layers not explicitly shown in the figure for clarity reasons.

The shown solution comprises at least two film layers 102, 102B and at least one intermediate material layer 104 of at least one material such as plastic resin provided, optionally e,g injection molded or casted, between them. The two film layers 102, 102B may be physically and e.g. electrically, thermally and/or optically connected through the at least one layer 104 by e.g. a number of connecting members 108 such as springs (e.g. fairly rigid wire), contact studs, lightguides or similar structures bridging the gap between the films or specifically, selected features thereof or thereon, e.g. electrically conductive/contact pads, traces, and/or electronic components, and/or at the edges (via flexible interconnects, springs, staples or similar methods), enabling the necessary connections. However, as being clear the film layers or features thereof/thereon do not have to be physically connected in all embodiments, while they may still functionally couple to each other or affect each other's function.

In various embodiments, the film layers 102, 102B (note that there may be further film layers in the structure as well) may comprise mutually same or different materials. Likewise, their 102, 102B general construction may be mutually similar or different.

In various embodiments, the film layers 102, 102B may generally comprise or consist of one or more material(s) such as plastics, e.g. thermoplastic polymer, and/or organic or biomaterials with reference to e.g. wood, paper, cardboard, leather or fabric, or a combination of any of these materials with each other or with plastics or polymers or metals.

Either of the layers 102, 102B may be visible to the environment of the structure 100 and they may even define exterior of the structure 100, whereupon they may have aesthetic/decorative or other visual function, and possible a tactile function (e.g. provision of desired feel with selected surface roughness). Any of the layers 102, 102B may define or contain holes such as recesses or through-holes for accommodating features such as components or e.g. conductive vias.

For example, any of the layers 102, 102B may generally comprise or essentially consist of thermoplastic material. Any layer 102, 102B may contain composite material. Any layer 102, 102B may comprise a coating on either side thereof. Any layer 102, 102B may be essentially flexible or bendable, at least in places. In some embodiments, the film layer 102, 102B may at least locally be substantially rigid and stiff. The thickness of each of the layers 102, 102B may vary depending on the embodiment; it may only be of few tenths or hundredths of a millimeter, or considerably thicker, in the magnitude of one or few millimeter(s), for example. Any layer 102, 102B may be of constant or varying thickness and/or generally construction.

Based on the foregoing, each or any of the layers 102, 102B may, for example, comprise at least one material, or several materials, selected from the group consisting of: polymer, thermoplastic material, electrically insulating material, electrically conductive material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, composite material, organic material, biomaterial, leather, wood, cellulose, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

For instance, in some embodiments, film layer 102B may be essentially homogeneous (e.g. of selected electrically insulating or conductive material, e.g. a metal sheet) that may still accommodate, e.g. thereon, a number of further features such as aesthetic/visual or generally optical features, thermal features, chemical features, and/or electrical features. Alternatively, the film layer 102B may be heterogenous in terms of at least one selected property such as electrical conductivity or material. Accordingly, the mutually different portions of the layer 102B may define selected functional or other features, e.g. electrode or other sensing element, electromagnetic shield, field shaping feature for adjusting the response of e.g. capacitive or inductive sensing electronics provided e.g. on layer 102, or other features.

The aforesaid at least one intermediate layer 104 refers to at least one material layer provided first e.g. onto to film layer 102, 102B or directly between the layers 102, 102B by molding, such as injection molding, or casting such as dipping, for instance, of the associated material(s). Alternatively or additionally, layer 104 may have been arranged onto the film layer 102, 102B through laminating it e.g. as ready-made element thereonto utilizing e.g. mechanical bonding, chemical bonding, electrical bonding, electrical bonding, heat, pressure, solvent and/or adhesive.

The at least one layer 104 may generally comprise a number of materials such as polymer, organic, biomaterial, composite material as well as any combination thereof. The material may comprise thermoplastic and/or thermosetting material(s). Thickness of the included layer(s) and other features, and thus of the overall structure 100, may vary depending on the embodiment. It may be, for example, in the order of magnitude of one, few or tens of millimeters. At least some of the material of at least one layer 104 may be e.g. electrically insulating or conductive. In some embodiments, the layer 104 may, for example, comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin. The layer 104 may be of substantially homogeneous or heterogeneous construction.

At least locally, there may be a number of further layers (e.g. coatings, further film layers, printed conductive layers defining e.g. circuit design/traces or graphics) or generally speaking features defined by or provided in and/or on film layers 102, 102B, at least one intermediate layer 104 (on any or both sides, and/or embedded) and/or elsewhere in the structure. Even if only a single feature has been illustrated e.g. as a rectangular or essentially square block at some particular location in the figure for clarity, a person skilled in the art shall acknowledge that fact that it may refer to or comprise a plurality of, mutually different and/or similar, features such as an electrical circuit with traces, components and/or other elements that may optionally be e.g. electrically (e.g. galvanically or capacitively) or otherwise, e.g. optically or at least generally functionally, connected together.

These potentially, still depending on a particular embodiment, included additional layers and/or other features 103, 105, 110, 112, 114, 116, 118, 120, 124, 126 may indeed have been assigned a variety of functions, e.g. protective, aesthetic, decorative, informative or other visual/optical function, electrical function, processing function, controlling function, memory function, communication function, sensing function, (electromagnetic/electric) field shaping function, (e.g. electromagnetic/electric) shielding function, conductive function, insulating function, attaching or securing function, and/or spacing function, etc.

The provided features such as spatially more extensive layers 103, 126 such as printed, coated, deposited, molded or otherwise laminated layers, or more local elements 105, 110, 112, 114, 116, 118, 120, 124 may each have dimensions such as thickness of their own (shown in the figure) as well as characterizing materials. Alternatively, multiple features such as layers 103 105, 118 could mutually have at least partially identical or similar configuration in terms of e.g. thickness or materials.

The aforementioned features may thus include, for instance, at least one element selected from the group consisting of: electrical conductor such as trace, printed electrical conductor, electrical insulator, electrical conductor, electrical circuit design, contact pad, circuit trace, electrode, electromagnetic shield, hatched shield, EMI (electromagnetic interference) shield, RFI (radio frequency interference) shield, electric or electromagnetic field shaper or attenuator, graphics, graphic ink layer, conductive ink layer, visual indicator, electrical element, electronic component, integrated circuit, optical element, light-emitting element, LED (light-emitting diode), OLED (organic LED), light detecting element, lens, light directing element, light diffractor, light collimator, light reflector, diffuse reflector, specular reflector, lightguide, sensor, pressure sensor, proximity sensor, switch, piezoelectric element, haptic element, electromechanical element, processing element, antenna, memory element, connector and communication element.

In various embodiments, e.g. one or more of the electrically conductive features may comprise at least one conductive material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance. In some embodiments, electrically conductive or insulating features defined by, in or on any of the layers or other features of the multilayer construction may have a further function such as aesthetic, informative, visual or generally optical function, e.g. masking function.

One or more of the features may have been produced directly to the multilayer structure 100 or a particular constituent element, such as film layer 102, 102B thereof utilizing e.g. printed electronics technology such as screen printing, flexography, gravure, offset lithography, or ink jetting. Alternatively or additionally, e.g. etching or applicable coating method such as silver or flow coating may have been utilized. As a further option, ready-made features may have been attached to the structure using e.g. adhesive, heat and/or pressure, optionally in the form of a selected lamination method. Yet as a further option, one or more features such as conductive traces, components, heat conducts, and/or other elements could have been provided on at least partially pre-prepared carrier such as tape (e.g. adhesive tape or specifically, adhesive transfer tape) that is then arranged onto the film layer 102, 102B or generally, to the structure 100.

In various embodiments, one or more of the included layers and/or further, e.g. more localized, features may at least partially be optically substantially opaque or at least translucent, having regard to predefined wavelengths e.g. in visible spectrum. These items may have been further provided with visually distinguishable, decorative/aesthetic and/or informative, features such as graphical pattern and/or color thereon or therein. Generally, IML (in-mold labeling)/IMD (in-mold decoration) technique is applicable for manufacturing such. The items may be at least partially, i.e. at least in places, optically substantially transparent to radiation such as visible light emitted by e.g. in-structure or other electronics thereon. The transmittance may be about 75%, 80%, 85%, 90%, 95% or higher, for example.

In various embodiments of the structure 100, the included features may include electronics such as control and/or specifically sensing or measuring electronics that has been provided to at least one layer, such as film layer 102, of the structure 100.

For instance, items 103, 105 on layers 102, 102B, respectively, could comprise a circuit design comprising at least conductive traces (alternatively or additionally, a similar feature could be on the opposing side of layer 102, 102B as well, but omitted in the figure in favour of clarity), item 114 could comprise an electronic component, e.g. integrated control circuit or other control/measurement electronics, and item 116 could comprise sensing element such as an electrode discussed hereinafter in more detail. Items 110, 112, 120 could represent e.g. further components, sensing elements or connecting features such as a connector to external system or e.g. host device. Item 118 could include e.g. a shielding feature and item 126 to top protective, decorative, graphics-containing, masking or optically translucent/transparent, informative, or otherwise meaningful and functional layer.

In some embodiments, layer 102 could represent or be at least situated closer to the intended back side of the structure 100 from the standpoint of user or use environment (e.g. target sensing volume or area) that interfaces with or is at least closer to layer 102B, wherein the back side could thus be optionally positioned closer and potentially even attached to or otherwise integrated with a host device or structure such as a host device, surface, or panel in a vehicle (e.g. in-vehicle panel on a dashboard, door, centre console, etc.) or some other host structure. However, in other embodiments, the situation could be reverse (i.e. layer 102B could reside closer to the user/use environment), or the structure 100 could face the user or use environment from multiple directions.

The aforesaid electronics included may indeed contain e.g. control circuit(s) or control circuitry for sensing purposes and/or other uses. At least, the included electronics preferably includes a number of sensors or sensing features e.g. in the form of a number of electrodes, which may be in turn driven and/or measured by the control circuitry, e.g. circuit such as integrated circuit and/or a circuit containing separate, connected components, over a galvanic or wireless connection, wherein the control circuitry may reside in the structure 100, e.g. provided to film 102, or be external to the structure 100 and be connected to the structure via connecting elements such as an (electrical) connector and/or wiring. The sensing features could be wireless such as capacitive or inductive by nature.

The sensing features such as electrodes could be controlled so as to establish e.g. electric, magnetic or generally electromagnetic field in the environment of the structure 100.

In various embodiments, any of the features such as a feature 116 of or on film layer 102, may comprise or define an electrode or other sensing element for self-capacitive sensing. The element may be configured (material, dimensions/positioning/distances, etc.) so as to define a reference parasitic (electrostatic) capacitance to a reference potential such as system or circuit ground, which may be altered (increased) by an object such as a user's finger touching the multilayer structure 100 or hovering around it and detected or measured by the associated control electronics, for example, through measuring the time constant of RC circuit comprising the electrode. The element may thus define e.g. a user input feature such as capacitive or specifically, parasitic touch/gesture input area or volume, or a "button". To the user the element or associated sensing area/volume may be indicated using e.g. forming of the concerned surface area in the structure (e.g. recession or protrusion, such as dome or bowl shape) and/or graphical or optical indicators (e.g. lighting).

In various supplementary or alternative embodiments, preferably a plurality of features such as features 116, 124, e.g. on the different sides of layer 104, may define electrodes for mutual capacitance sensing. Here, the control electronics are configured to measure changes in, such as decrease due to the object, mutual capacitance between at least two, first and second, electrodes, at least one of which being the driven/transmit electrode and at least one another sensing/ reception electrode. Accordingly, a feature 116 may define a first electrode on the first side of the layer 104 whereas e.g. feature 124 may define a second electrode on the second, opposing side in the structure 100, both being connected to the circuit of the measuring/control electronics.

In various embodiments, at least one feature such as feature 118 could define a shield, e.g. electromagnetic shield such as a floating electromagnetic shield, active (driven) shield or (system/circuit) grounded or earthed shield for shielding e.g. underlying electronics such as sensing electronics, related circuits or specifically circuit traces, from external electromagnetic fields or interference. For instance, a shield for feature, e.g. trace, circuit or component 103, 114 on layer 102, may be provided by feature 118 that may define an area or volume of electrically conductive material, optionally being galvanically connected to the system/circuit ground.

In various embodiments, at least one feature (e.g. item 128) may define a field adjuster that is configured to alter the surrounding electromagnetic field (near-field) established e.g. by the sensing electronics. The adjuster may be dynamically controlled by the electronics (active/driven) or passive. It may be connected to the associated system ground or be floating.

Thus, having regard to aforementioned field adjusting type features and e.g. shielding features of layer 102B as well as electronics essentially in/on layer 102, the layers 102, 102B may but may not have to be connected e.g. electrically so that the various features would galvanically connect to the same circuit, depending on the embodiment. In cases where e.g. effective permittivity or e.g. permeability of the material of the adjuster or shield feature is used to shape fields around capacitive sensing elements or antenna radiators, such connection may be unnecessary, although the connection enables e.g. dynamic control.

In various embodiments, functionalized graphics may be exploited, i.e. conductive material such as ink or paint may be added in the structure 100 for both decorative/aesthetic/informative and electrical purposes including e.g. formation of a conductor such as circuit trace, contact pad, sensing element such as (capacitive) electrode or "capacitive button", sensor pattern such as electrode pattern, field shaper, shield, etc. For instance, silver, carbon nanotube, carbon nanobud and conductive polymer inks can be well functionalized in this aspect. A conductive ink may be supplemented with desired colored ink thereinto. The desired color may be generally achieved in the material by the use of a suitable dye or pigment.

Many if not most of e.g. conductive inks are more conductive than they need to be to sufficiently function as a touch sensing electrode. Most conductive inks can also be colored at least slightly. The achievable effect depends on the distribution and appearance of conductive materials and the extent to which the material can be diluted while retaining acceptable conductivity. "Diluting" the conductive ink with color inks can open up a whole new range of possibilities in creating interesting and attractive patterns and textures that serve both decorative and functional purposes. Coloring conductive inks allows diluting the relatively costly materials for large-area shield, adjuster, sensor and radiator/antenna prints, for example, thus reducing production costs.

For example, shielding, capacitive touch or other sensing electrodes, antennas, antenna resonators and so on can be hidden, masked or camouflaged from external viewer while still positioned close to the external surface, when using functionalized graphics inks or similar substances. Even complex sensor patterns can be "hidden in plain sight", making visually interesting features available to designers. The implemented functionality may thus become practically invisible at least to anyone not knowing exactly what to look for.

Layers and other features can be shielded from both sides while appearing to have uniform coloration with only the visual cues needed for user interaction visible, or possibly only activating when the user approaches the surface, with reference to e.g. printed contour lines or other indications indicative of a location of a sensing area or generally sensing feature, or e.g. underlying light sources configured to dynamically (turned on when sensing input awaited/sensing function active, or e.g. blinking) illuminate the sensing area.

As a related example, e.g. touchpad or other touch area sensing electrodes may be printed on a surface such as layer 102B in desired shapes such as geometric figures or e.g. sprawling vine patterns. Getting the sensor patterns so close to the exterior or generally target sensing surface may be beneficial in terms of sensing performance (sensitivity, directionality, etc.) in various use scenarios.

As a further example, a selected conductive ink or paint, e.g. black ink, may be configured to establish a visually distinguishable feature such as a graphical pattern, while it can further used to shield the underlying sensing electronics such as traces from ghost touches, i.e. fault detections, and/or used to shape the electromagnetic fields e.g. around touch buttons or other sensing features. Patterning black ink can be done so that the resulting isolated patches form parasitic resonator type antenna elements (shapers) to affect the field established or sensed by the underlying electrodes.

Antenna resonators or other functional features may be thus generally hidden e.g. in detectable geometric or other visible patterns on a film layer 102, 102B when using conductive inks.

In various embodiments, provision of electrical connection to colored conductive ink pattern or similar feature may be arranged via a connecting feature or contact point, such as an opening in adjacent layer, such as intermediate layer 104 or a hosting film layer 102, 102B for contact features such as wiring. The contact point may be hidden in the pattern.

One feasible option is to add strongly colored ink to a conductor ink with similar chemistry and solvents. Some conductive inks are derivatives of heavily filled (typ. black or white) graphics ink formulae, while some are heavily customized and more difficult to add color to. For these cases, adding a dry pigment with ink-specific solvent to restore flow properties may be appropriate.

Having regard to providing e.g. colored conductive material such as inks on a target surface such as film 102, 102B may not have to be essentially different from providing or specifically printing any ink, though e.g. screen properties in the context of screen printing can be optimized by testing when desired or required. As colored conductive inks may be well used e.g. in applications where conductivity is not maximally critical, the printing quality can be correspondingly optimized for visual quality over conductive properties.

Even though the multilayer structure 100 has been illustrated as a rectangular stack, it may generally or locally define various shapes as e.g. the film layers 102, 102B may be formed using e.g. thermoforming or cold forming to exhibit desired 3D shapes (after or prior to providing features such as electronics thereon) whereafter further layers such as intermediate layer 104 could be provided.

Various characteristics and features of a more generic or potentially multi-purpose multilayer stack 100 described above may be freely and selectively adopted in any of the more specific or dedicated embodiments described hereinafter, and vice versa, as being naturally easily understood by a person skilled in the art. Yet, the following descriptions of various embodiments have been produced to set forth particular, selected aspects in the context of the present invention, whereupon the associated disclosures may still lack features not essential from the standpoint of understanding the particular aspect. However such features are still fully possible and in many cases advantageous to include in the concerned, disclosed multilayer structure even if not explicitly disclosed (e.g. if electronics is included in the multilayer structure, it may well be advantageous to provide external electrical connection, "system connection" etc., thereto using suitable connecting members such as connectors, wiring, internal connecting features, etc.), as being also easily apprehended by a person skilled in the art. Yet, the features and characteristics of the following embodiments may be mutually selectively combined by a person skilled in the art to come up with further embodiments wherein the functionalities underlying the features are preferably offered by a common multilayer structure.

Figure 2:
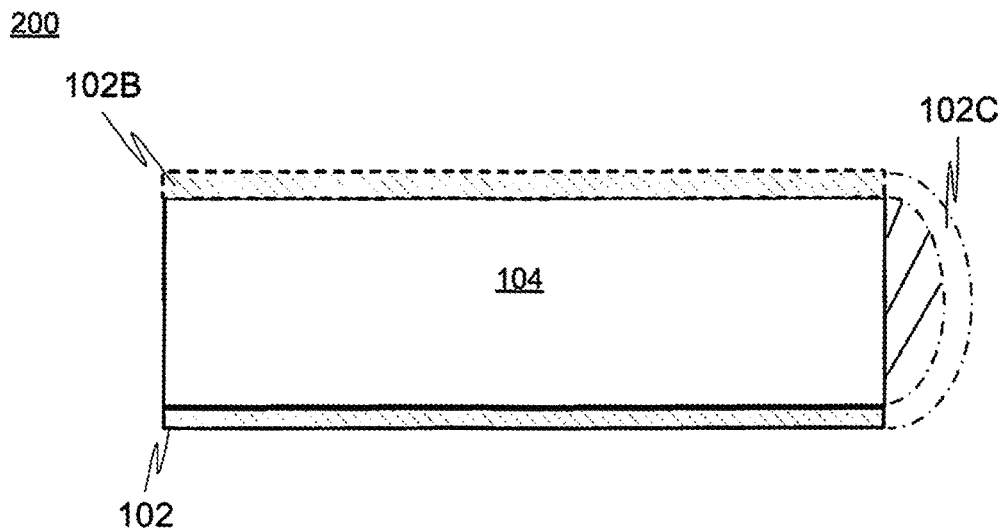
FIG. 2 illustrates one other, supplementary or alternative, embodiment of a present invention, wherein several layers of a multilayer structure are established by a single film.

FIG. 2 illustrates a multilayer structure 200 that has been simplified from the one of FIG. 1 for clarity, but a person skilled in the art shall acknowledge the fact that the structures 100 and 200 may in essence be mutually very similar or rather different in terms of included layers and other features, used materials, dimensions, etc., however with at least one difference arising from the construction of film layers 102 and 102B.

As being already alluded to hereinbefore, in some embodiments a common substrate film 102C may be folded or bent, as being also shown in the figure via the broken lines at the perimeter, so as to define several layers 102, 102B in the multilayer stack (layer 102B could be considered to be formed from an extension of substrate 102 or vice versa) instead of using separate films for the layers 102, 102B. The connecting intermediate portion could remain in the structure or be at least partially processed and/or removed afterwards by cutting, for example.

The connecting intermediate portion may contain or be provided, optionally by printing, conductive features such as traces to electrically connect the film layers 102, 102B and e.g. electrical features thereof such as traces, circuit designs, sensing elements and components, together. Multiple film layers established from at least originally a common film could be ultimately provided on the same and/or different sides of the layer 104 in the multilayer stack 200. As shown at 108 (FIG. 1), the layers 102, 102B may be optionally further connected together by e.g. electrically conductive vias provided through intermediate layers such as layer 104, and/or using other connecting and preferably conductive feature(s).

By the shown solution, potential flush-out and connectivity problems arising from the use of discrete connecting parts such as springs and pins connecting the layers 102, 102B could be practically eliminated.

Features such as electrical features (traces, electrodes, etc.) or even electronic components could be first provided, optionally by printed electronics technology, on any side of a film 102C, which could be then optionally formed such as thermoformed to exhibit a desired three-dimensional shape, cut and/or bent prior to provision of at least one layer 104 in between by injection molding or casting, for example.

In some embodiments, the intermediate portion could be shaped, e.g. cut, to reduced width in contrast to e.g. layers 102, 102B, or structure 100, 200 in general, to accommodate e.g. printed conductors but to reduce the amount of unused space.

In some embodiments, even more versatile bending of film 102C could be performed to establish therefrom e.g. three layers in the structure 200 ('S' type bend with top, middle and bottom layers).

Figure 3:
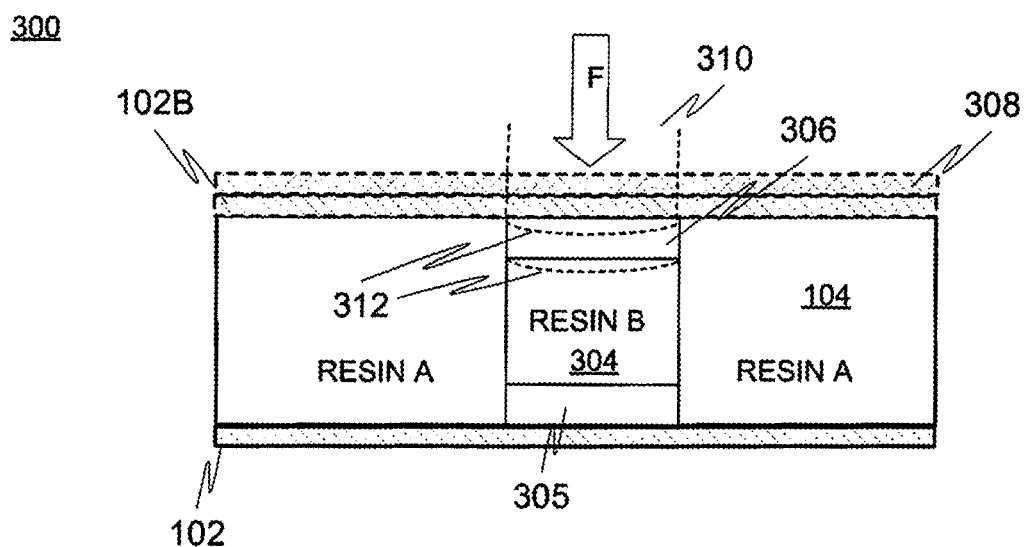
FIG. 3 illustrates one embodiment of a force-sensing capable multilayer structure in accordance with the present invention.

FIG. 3 illustrates one embodiment 300 of force sensing and e.g. touch sensing capable multilayer structure in accordance with the present invention with improved sensitivity.

Essentially as background information, it can be mentioned that it is rather typical to e.g. many self-capacitive sensing solutions that relatively high deflection of a cover material is a requisite to cause a sufficient pressing effect in terms of sensing function. This challenge could be tackled by including structure deformation-facilitating air cavities inside the multilayer stack as mentioned hereinbefore. Air-filled cavities may, however, add to delamination sensitivity of the structural layers of the stack. Yet as another potential challenge, use of e.g. metallic overlays or generally top/upper layers, while possibly preferred due to looks, feel, or e.g. durability, may prevent the operation of underlying self-capacitive sensing solution practically completely.

Therefore, in the shown embodiment, a desired level of material deflection responsive to external force F directed to a sensing location of the structure 300 in favour of enhanced sensing sensitivity is obtained by a volume of at least one, more elastic, or "softer", material 304 provided below dedicated sensing location or sensing area 310 (indicated by the broken lines), between or embedded in the surrounding other, less elastic material of intermediate layer 104 between film layers 102, 102B so that responsive to external force exerted on the structure 300 towards the structure internals substantially at the location of sensing area 310 and underlying material 304, the structure locally compresses.

Even small deformation 312 may translate into an easily detectable change in the mutual capacitance between electrodes 305, 306 arranged on the opposite sides of material 304, which may have been printed using e.g. printed electronics technology or some other production method on film layers 102, 102B, one of the electrodes 305, 306 preferably acting as driving/transmission electrode and the other one as sensing/reception electrode. The amount of force, not merely touch as binary type detection, may be measured as the measured signal is proportional to used force and the solution may be used as analog force sensor instead of or in addition to a "mere" touch sensor.

The electrodes 305, 306 may have been galvanically connected to corresponding driving and measurement circuitry using e.g. traces and conductive via(s) through material layers (not shown in favour of clarity), and/or the solution of FIG. 2. A person skilled in the art shall realize that instead of isolated electrodes and a single (sub-)volume of material 304, multiple electrodes or an electrode pattern for e.g. grid type sensing could be carried out respectively.

The solution is applicable even if conductive element such as metal sheet 308 is provided upon the film 102B, at least partially covering the sensing area 310. Accordingly, touch-through-metal functionality may be implemented.

The material 304 may be selected so as to have relatively high permittivity, e.g. relative permittivity over about 5 and/or exceeding the one of material 104, to enhance the sensitivity of touch/force sensing.

In some embodiments, instead of or in addition to capacitive sensing, two opposing inductive loops could be configured at 304, 306 for inductive sensing, for example.

Figure 4:
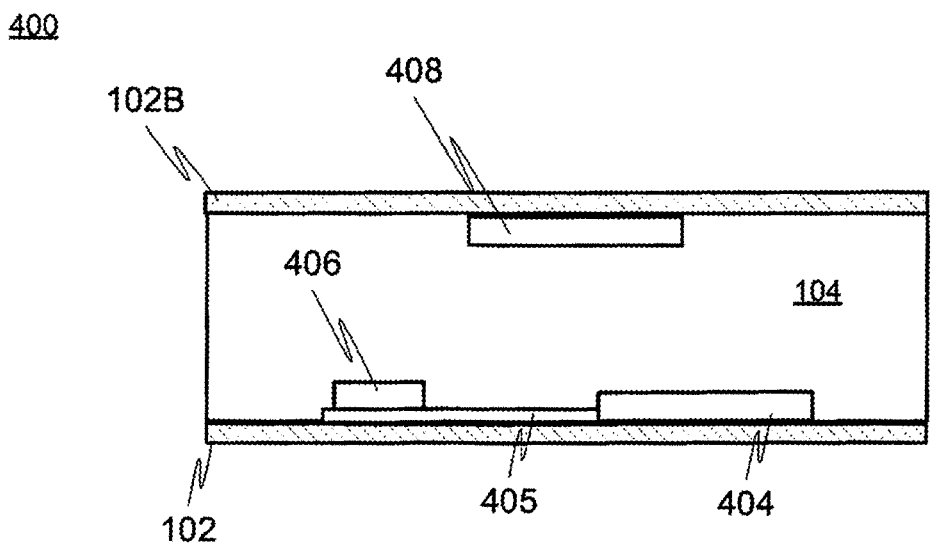
FIG. 4 illustrates one embodiment of a multilayer structure in accordance with the present invention, involving field shaping through the use of active/feeding element and functionally associated shaping element having no galvanic connection therewith.

FIG. 4 illustrates at 400 one embodiment of a multilayer structure in accordance with the present invention, involving field shaping through use of active sensing or "feeding" element and functionally associated shaping element optionally having no galvanic connection with the active element. The solution is suitable for touch and proximity (non-touch/contactless) sensing purposes, for instance.

Film layer 102 may be provided with control and/or sensing or measuring electronics such as related circuit or circuitry 406 (at least part of such circuit/circuitry could also be external to the structure 400 and connected thereto using suitable connecting elements such as wiring) that is preferably galvanically connected 405, e.g. via traces arranged, optionally printed by printed electronics technology, on the layer 102, to e.g. capacitive or inductive sensing element 404 defining a number of electrodes, for instance. On the other side of intermediate layer 104 is provided at least one field shaping element 408 such as conductive element comprising metal or other electrically conductive material at layer 102B, e.g. defined by the material of the layer 102B or provided thereon using e.g. applicable printing (e.g. preferred method falling under printed electronics technology), deposition, lamination or coating technique.

By positioning the shaping element(s) 408 (in the case of multiple ones, at least some of them may be e.g. galvanically connected together and/or remain separate) at a distance from sensing element 404 on a different plane as in the depicted example, the electric or electromagnetic field, or specifically near-field, established by the element 404, which could be considered as a near-field antenna, may be flexibly controlled such as attenuated, boosted, shaped, and/or directed so as to provide desired sensitivity characteristics for sensing purposes, e.g. touch sensing having regard to a predefined touch area defined upon layer 102B and/or proximity sensing having regard to a sensing volume upon layer 102B.

In addition to or instead of more "passive" field adjustments provided by material selection, shape, dimensions, positioning, etc. of element(s) 408, at least one of the shaping elements 408 could be actively or dynamically controllable. Such controllability could be provided to the element 408 by e.g. galvanically connecting it to electronics 406 within the structure 400 or external thereto.

Accordingly, voltage and/or current may be supplied to the element 408 to control its field shaping properties as desired based on e.g. finding the application-specific sweet spots by sufficient testing process involving field measurements. Several layers of the multilayer stack and features thereon/thereof could be generally connected together either through the stack/intermediate layers using e.g. conductive material or by the solution of FIG. 2, for example.

In some embodiments e.g. gigahertz frequency range operable antenna, such as Bluetooth™ antenna, could be produced in a multilayer structure according to similar principles, providing antenna feeding element (typically galvanically connected to control circuitry) and remote/separate radiator that may be wirelessly such as capacitively coupled to the feeder. The resulting antenna structure may be made very thin and flexible, suitable for use in various applications such as wearable electronics. Impedance matching between the feeder and radiator could be accomplished by duly designing the wireless coupling between them without a need to rely upon discrete matching components.

Figure 5:
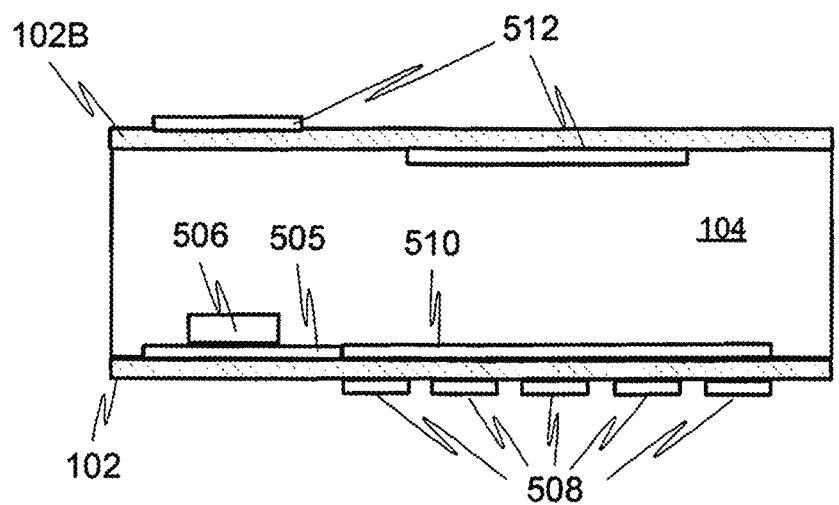
FIG. 5 illustrates one embodiment of a multilayer structure in accordance with the present invention for e.g. multi-touch sensing.

FIG. 5 illustrates an embodiment 500 of a multilayer structure in accordance with the present invention for multi-touch sensing.

At least one constituent electrode pattern, such as a line or e.g. diamond pattern among other various options, has been provided on both sides of the film layer 102, one 510 on side or surface facing the layer 104 and another 508 on the opposite side or surface facing the environment of the structure, e.g. host structure or device, or additional material layer (not shown) thereof. Together these, mutually different or similar constituent patterns, in terms of e.g. used shapes, their dimensions, spacing, material, alignment and/or orientation, establish a desired overall sensing pattern such as X-Y grid of column and rows, wherein the columns and rows may be mutually perpendicular (as implied in the figure by the line "ends" shown at 508 and longitudinal side profile of outermost line at 510) or arranged into some other configuration.

Alternatively or additionally, other surfaces or layers of the structure 500 could be harnessed into carrying electrode patterns of multi-touch capable sensing arrangement. For example, film layer 102B could carry an electrode pattern 510 or 508 instead of layer 102. In some embodiments, three, four (e.g. on both sides of both film layers 102, 102B) or more overlaid patterns could be provided in the structure 500.

In various embodiments, the patterns 508, 510 are configured for capacitive sensing such as capacitive touch or multi-touch sensing. Touch input as such could be then used to control or specifically, activate and de-activate, for instance, different functions of the structure 500, host structure or e.g. external device.

Control electronics 506 such as measuring circuit or circuitry may be connected to the patterns using e.g. conductor traces or other, typically electrically conductive, elements 505 optionally printed utilizing e.g. printed electronics technology. Alternatively or additionally, at least part of the electronics 506 could reside external to the structure 500 and connected thereto using applicable connecting elements such as conductive wiring.

In various embodiments, the structure 500 may be provided with a number of further features that may be aesthetic, decorative, informative, other optical (light directing or manipulation) features, electrical features, thermal management features, lighting features, etc. For instance, in the shown scenario a number of features 512 on either or both sides of film layer 102B, or embedded in or defined by the film shape and/or material, could include e.g. decorative, informative, lighting (e.g. light sources, waveguides, etc.) and/or other (functional) features superimposed with the underlying sensing features 508, 510 optionally so as to contribute to the sensing arrangement by illuminating the sensing area upon layer 102B, for example.

Arranging several film layers 102, 102B and potential other layers in the structure facilitates integration of various features in the structure, maintaining their distance large enough from the standpoint of reducing mutual disturbances or optimizing their functioning otherwise. Several layers of the multilayer stack may be connected together either through the stack/intermediate layers using e.g. conductive material or by the solution of FIG. 2, for example.

Figure 6:
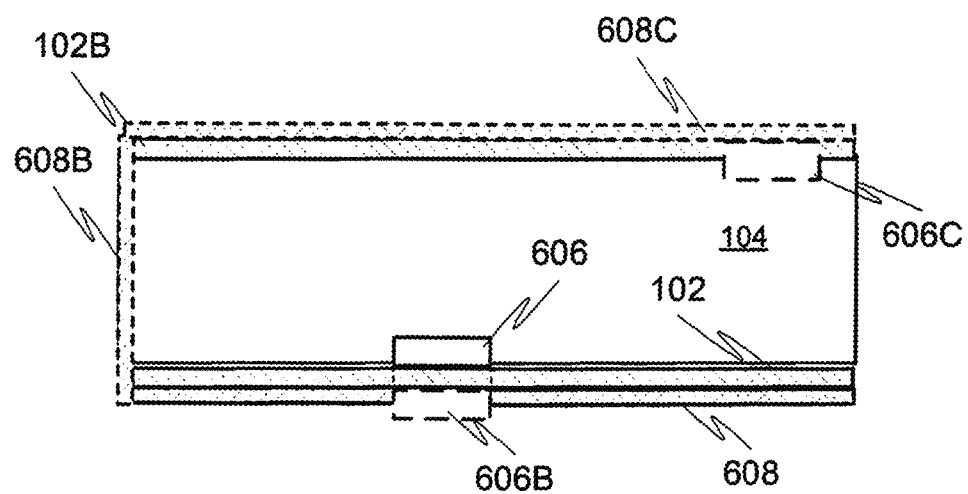
FIG. 6 illustrates one embodiment of a multilayer structure in accordance with the present invention with integral functional coating(s).

FIG. 6 illustrates at 600 an embodiment of a multilayer structure incorporating at least one integral functional coating in addition to sensing functions. It is noteworthy though that the solution could be utilized also in isolation or other contexts, without a need to include especially sensing features in the structure. The coating may have aesthetic, decorative, informative and/or other optical function, such as reflective function. Yet, it may have a number of further functions including protective function, electrical function, thermal function, etc. Thus, a multi-function coating may be provided to the structure 600. Accordingly, a coating may in some embodiments be considered to establish a feature of its own or establish a part of and bring desired qualities to some other, potentially aggregate, feature.

In the shown example the structure 600 has been provided with e.g. thermally and/or electrically conductive coating 608, optionally as a post-processing task, upon film 102 but coating could be alternatively or additionally provided to other surfaces and generally elements of the structure 600 as well, as being depicted by item 608B drawn using broken lines and defining the exterior of a side wall of the structure 600, adjacent e.g. plastic layer 104. Indeed, coatings may generally define one or more internal layers and/or exterior surfaces of the structure. In some embodiments, most if not practically the whole exterior surface of the structure 600 could be provided by one or more coatings.

For instance, coating 608 may comprise electrically conductive material such as metal. It may be configured to provide electrical connection (e.g. power, communication and/or control) to a number of electronic features 606, 606B, such as a light-source (e.g. LED) or other component arranged to the structure, e.g. film 102 thereof.

It 608 may directly electrically contact the feature 606, 606B or there may be intermediate conductive features such as conductive vias, traces, rivets, springs, studs, rods, etc. arranged in the structure 600 (note the broken vertical lines). Conductive plating may be patterned (masking, post-deposition processing) to better suit e.g. current carrying use and to enable utilizing e.g. at least portion of the plating as a further functional element, e.g. antenna resonator, sensing electrode, field shaper, shield, etc. Film layer 102B may define or host a number of features not shown in the figure in favour of clarity. In some embodiments, layer 102B could be covered or implemented by coating 608C in addition to or instead of coating 608 on film layer 102. Yet, the coating 608C on layer 102B (could be on any side, but illustrated on top) could provide e.g. electrical connection to features 606C such as electrodes or other sensing elements, light sources or other components, either directly or via intermediate connecting members such as traces or conductive vias.

In structures incorporating reflectors or other optical features provided by metal coating, such as LED or other luminaires, coating may be, for example, split along an optically non-occlusive line to separate power rails and connected through the film to embedded parts. Split lines can be hidden through the use of e.g. NCVM (Non-Conductive Vacuum Metallization)-like non-conductive overcoat. This enables producing a luminaire or other item that has e.g. traditional looks but also control features such as electronics embedded in its structure. When e.g. the LEDs or other electronics are embedded inside the structure, the same continuous platings or generally coatings used as reflectors and/or power distribution wiring can be also used to wick away heat, making even the entire surface of the concerned part function as a large heatsink, increasing LED light output and/or extending part lifetime.

The coating 600 may refer, for example, to electroless plating (e.g. Cu, Ni), electrolytic plating (e.g. Cu, Cr, Au, Ag), or PVD (physical vapor deposition) coating incorporating e.g. metals and metal-like materials.

With metal coatings, excellent thermal and electrical conductivity may be provided. Yet, coatings may be relatively easily provided to items and layers of various, potentially complex, shapes.

Having regard to general applicability of different methods, thickness of e.g. PVD coating can be varied over a fairly wide window and it is possible to restrict spread with masking, for example. Stacking different materials may enable creating platings that are properly conductive and visually attractive, for example by stacking copper and chromium platings.

In various embodiments, also wet-processed platings, such as electroless copper or nickel with chromium overcoat, may be utilized e.g. in connection with hermetically sealed structures that are immune to water intrusion. Surface features such as connectors may be masked to protect them from exposure to the processing solution. Masking may be performed with a photoimageable spray mask, much as in circuit board manufacturing.

Plating or generally coating used for shielding can be locally thickened to conduct heat away from embedded electronics. This requires having process control adequate for locally increasing layer thickness to a meaningful extent.

As alluded to above, in some embodiments patterning a conductive coating or specifically plating can be used to create resonating structures for embedded antennas, cutting galvanic contact between the emitting electronics and outside environment. This can be beneficial e.g. in certain highly weather-exposed locations, such as blinker housings or "shark fin" antennas.

In various embodiments, metal coating may be provided to a host surface, e.g. film layer 102, 102B. Then the coated area may be locally formed to exhibit a three-dimensional shape, e.g. protrusion or recess (e.g. hemispherical dome or bowl) shape so that in the position of largest local material deformation (dome/bowl edges or generally shape edges) the coating is ruptured. The rupture line(s) may thus define the outline of a functional, potentially electrical, feature such as sensing, field shaping or shielding feature in addition to potential aesthetic or informative (e.g. indicates sensing area) function the coating has.

Figure 7:
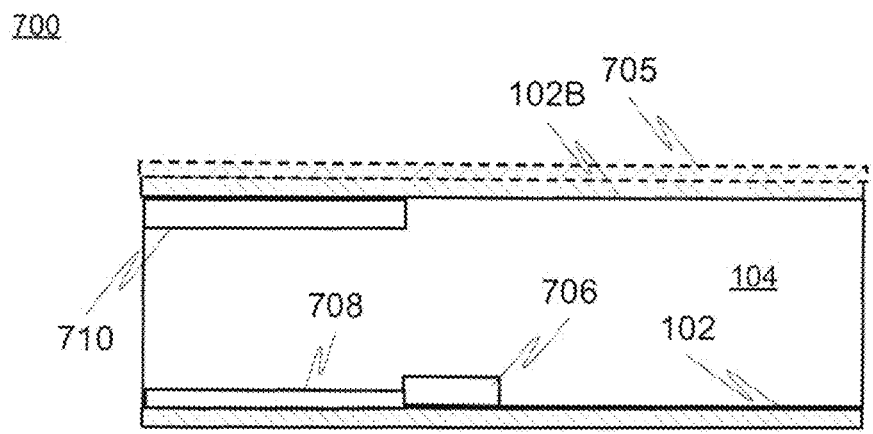
FIG. 7 illustrates one embodiment of a multilayer in accordance with the present invention having a shielding, such as trace shield, feature integrated therewith.

FIG. 7 illustrates at 700 one embodiment of a multilayer structure in accordance with the present invention having a trace shield feature integrated therewith.

The shown embodiment includes a sensing feature 706 such as sensing electrode provided on film layer 102. The feature 706 is shown on a top side of layer 102, thus facing the layer 104, but similar feature could be alternatively or additionally located on the opposite side. The top side may in some use scenarios be called a front side as it may face the user/use environment, whereas the opposite side may be called back side and it may then face e.g. a host device, host surface, or host structure.

However, as being clear the applicability of the suggested shielding solution is not limited to any particular use scenario or orientation, whereupon terms like "front" and "back" should not be deemed to restrict the feasibility of the solution only to cases wherein such terms are similarly relevant. The feature 706 may implement e.g. a capacitive sensing electrode such as self-capacitive sensing electrode or an inductive sensing electrode. Feature 708 refers to a further electrical feature such as trace or other conductive feature connecting the feature 706 to local or external control electronics (not explicitly shown, but already visualized and discussed hereinbefore multiple times with reference to other Figs) that may drive the feature 706 (provide voltage/current) and/or measure its characteristics such as changes in capacitance, etc.

A shielding feature 710 comprising e.g. metal or other conductive material has been provided to film layer 102B, either on the layer (e.g. at the bottom side as depicted, thus facing layer 104 instead of the environment, and/or on the top side facing and connecting to the environment directly or via further top layer(s) not drawn in the figure) by appropriate method such as selected printing or lamination method, or defined by the material and/or shape of layer 102B itself.

The shielding feature 710 is superimposed with the underlying feature 708, essentially preferably covering it at least from at least one selected direction. The feature 710 does not overlap with the actual sensing feature 706 to avoid reducing its sensitivity, but in some other embodiments, overlap could actually be desired to adjust the directionality of the sensing feature 706, for instance. When an object such as a finger or stylus contacts or approaches the structure 700 from top, or "front", direction, it does not induce disturbances e.g. in the form of false or "ghost" detections to the sensing feature 706 via feature 708 due to the feature 708 being shielded by feature 710.

Especially when relatively wide sensor traces are utilized (0.3 mm or wider) to enhance e.g. their durability when subjected to stretching during e.g. thermoforming or other processing, sensor traces are prone to unintentional touch detections and coupling to external electromagnetic noise.

By the suggested shielding, it is possible to improve false touch tolerance and to reduce electromagnetic noise coupling to such traces and facilitate maintaining the actual sensing features such as electrodes 706 relatively small (reduces space constraints, enables tighter layout of features, etc.).

The shielding feature 710 may be floating or grounded to e.g. system/circuit ground (grounding connection not explicitly shown in the figure but may be established by various measures discussed hereinbefore, connecting features. In some embodiments, it may be actively driven (e.g. galvanically connected to control electronics for such purpose).

The feature 710 may be any conductive layer of material e.g.:
  a) printed conductive hatch (cost optimized fill ratio per target), and/or
  b) printed layer of conductive ink, which may also establish part of decorative aspects of the structure.

As one additional note, when feature 710 is implemented on the bottom side of layer 102B as shown, it is still sufficiently far away from the (top) surface of the structure 700 regarding e.g. Electro Static Discharge (ESD) shielding.

Next, selected, still merely exemplary, implementation options are listed to facilitate a skilled reader's job in determining optimum choice for each particular use scenario in mind:
  1. Illustrated scenario, wherein traces and electrodes reside on the top side of one film layer (e.g. back film from the standpoint of user/use environment), and grounded shield on the bottom side of another, front film layer (above traces, i.e. between sensing input area/volume and traces)
  2. Same as above but using floating shield (not grounded)
  3. Same as above but signal is driven to the shield too (driven shield), which may add to e.g. liquid tolerance if driven shield surrounds sensor electrodes
  4. Sensor electrodes e.g. on bottom side of a first film layer (e.g. bottom layer 102), ground electrodes e.g. on top side of another film layer (e.g. 102B)+additional overlay 705 arranged on top of said another film layer. Overlay may include or consist of various materials including e.g. electrically insulating material. The overlay may include e.g.
  a. Veneer (e.g. wood);
  b. Fabric; and/or
  c. molded material or generally plastic material resulting from e.g. second shot surface injection mold (layer 104 may be molded as well as discussed hereinbefore)
  5. Two-layer touch surface or generally sensing pattern on two sides of a film layer (back/bottom film layer), protected with ground shield on other film layer (front/top film layer) over traces
  6. Multi-layer touch surface pattern on bottom side of front film layer and either side of back film layer. Ground electrode may be provided on top side of top/front film+ potential overlay added on top of front film
  7. Shield may be local or extend over a whole target surface with e.g. opening(s) provided for sensing area(s).

Figure 8:
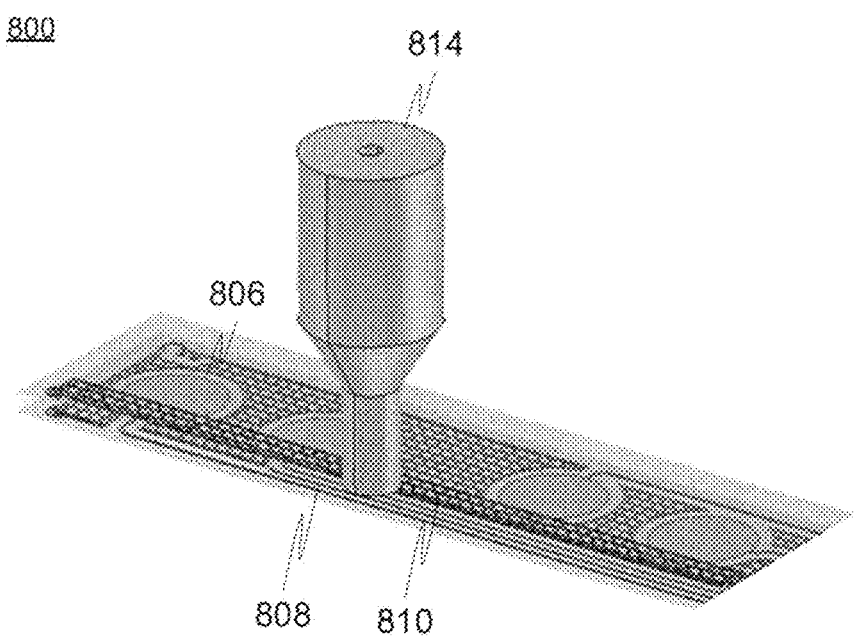
FIG. 8 illustrates a test scenario for trace shielding in accordance with the present invention.

FIG. 8 provides at 800 a coarse sketch of a test scenario conducted for evaluating trace shielding in accordance with an embodiment of the present invention. The multilayer structure is provided with a number of embedded sensing features such as electrodes 806 and associated connecting traces 808 towards control electronics, which can be provided in the structure or external to the structure via necessary connections. Item 814 refers to a testing object mimicking e.g. human finger or other stylus hovering upon the structure and/or contacting it over the traces 808. Item 810 refers to a possible (ground) shielding feature, such as hatched shield (hatch), embedded in the structure e.g. as discussed above.

Figure 9A:
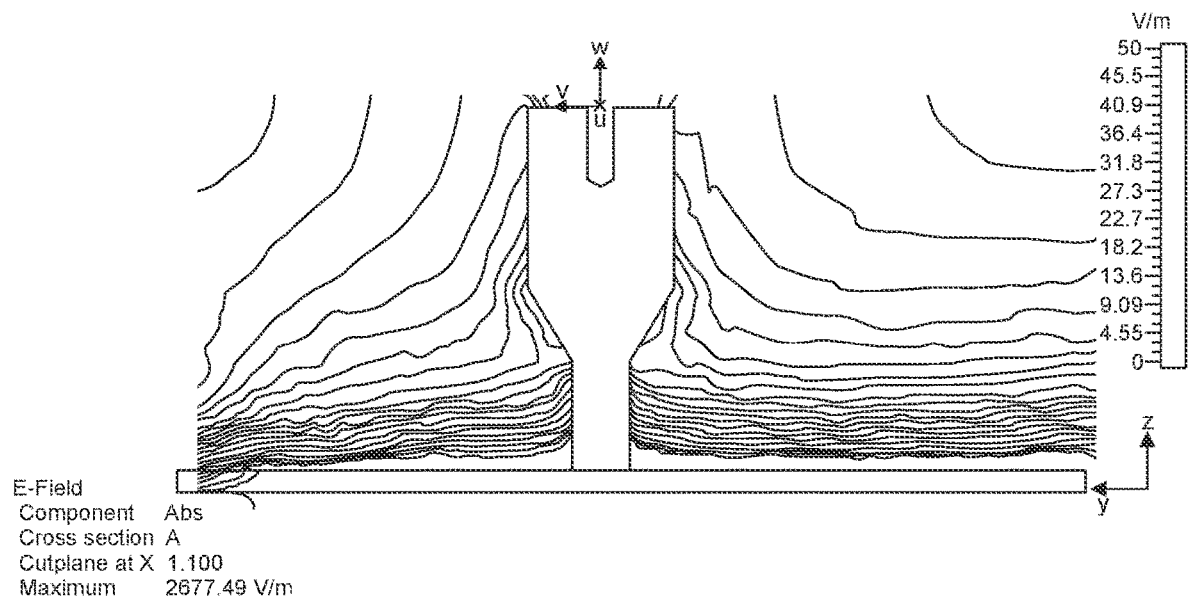
FIG. 9A illustrates the electric field as measured in the scenario of FIG. 8 without a trace shield feature implemented.

FIG. 9A illustrates the electric field in the scenario of FIG. 8 without trace shield feature embedded.

Figure 9B:
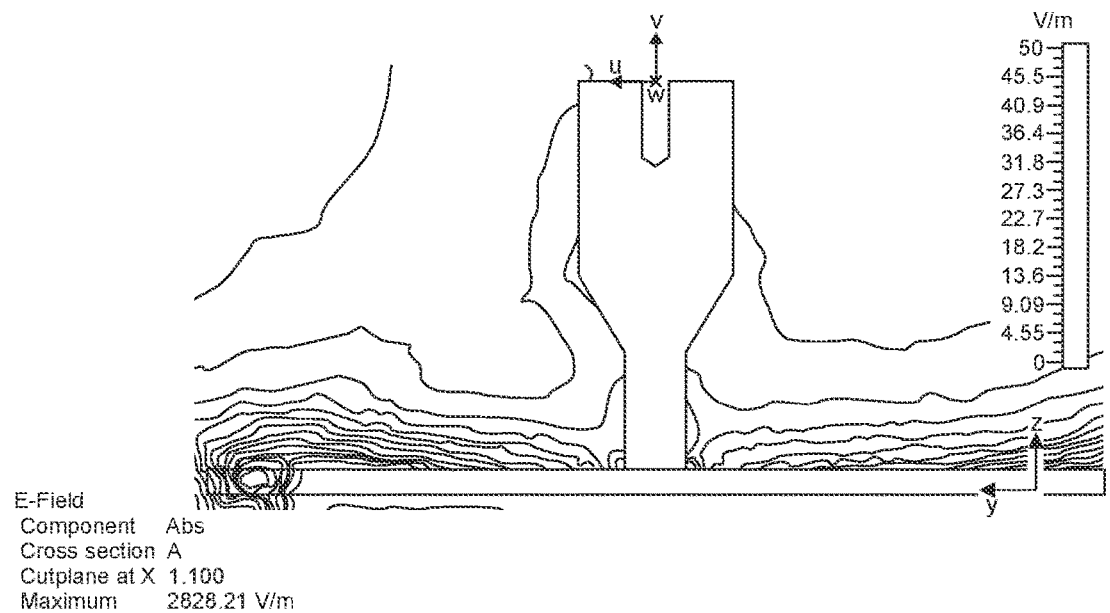
FIG. 9B illustrates the electric field when trace shielding is present.

FIG. 9B illustrates the electric field when trace shielding is present.

As can be easily detected from FIGS. 9A and 9B produced by simulations, it was noticed during the tests that the effect of object 814 placed upon the traces 808 is significantly weaker on the sensed signal when protected with a shield. As a result, smaller sensor electrodes may be used, providing better sensing feature spatial density, if desired, and also smaller manufacturing costs. Yet, with proper shielding wider traces may be exploited. Use of e.g. conductive vias may be reduced as traces may be hosted by same layer than actual electrodes. As the shield may be located relatively far away from the sensor trace (e.g. more than double the trace width), undesired capacitive coupling between them may be reduced. The shielding solution also provides generally enhanced protection against electromagnetic interference.

Figure 10:
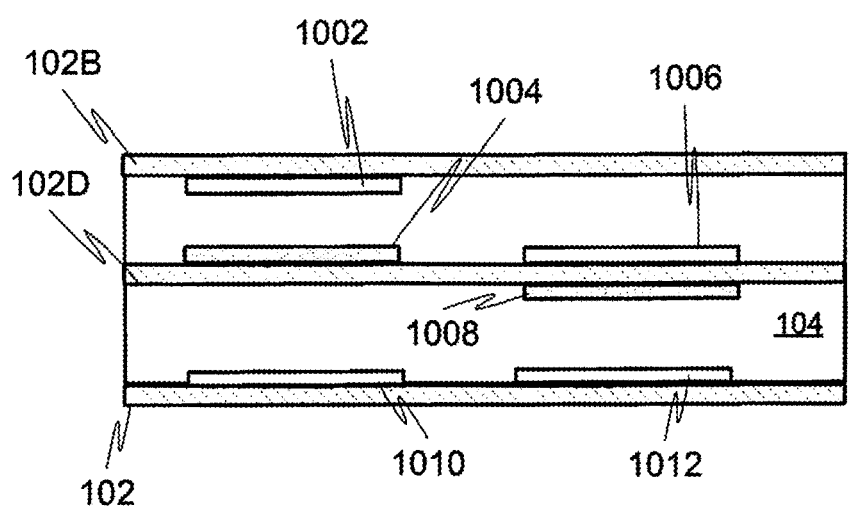
FIG. 10 illustrates an embodiment provided with a multi-surface or multi-directional sensing function.

FIG. 10 illustrates, at 1000, an embodiment of the multilayer structure, provided with a multi-surface or multi-directional sensing function for touch and/or proximity sensing, for example.

A need to provide e.g. touch sensors or generally a touch or proximity sensing capability onto the both sides of a multilayer structure, supportive of simultaneous activation without considerable mutual interference, may occur with reference to e.g. human machine interfaces of various devices including vehicles such as land vehicles/cars, aircraft, watercraft, spacecraft, etc., and their control panels or generally control features or surfaces, considering e.g. steering wheels and control sticks, offered to users such as pilots or passengers.

By the suggested solution, a further substrate element such as a film or film layer 102D defining or hosting at least one, optionally printed, shielding/grounding feature 1004, 1008 is arranged between two operational touch or generally sensing surfaces provided to film layers 102, 102B. Accordingly, the layer 102D integrates a shielding or specifically a ground plane that protects and practically isolates the top and bottom side or direction sensing features 1002, 1006, 1010, 1012 from mutual interference.

As indicated in the figure, layer 102C or other intermediate layer may accommodate a number of sensing features 1006. The film layer 102D may contain electrically insulating and/or conductive material, e.g. plastic or specifically, thermoplastic material. It may be flexible or substantially rigid. In some embodiments, it 102D may be established from the same film as at least one other layer 102, 102B in accordance with the embodiment of FIG. 2 (102C).

Although not shown in the figure, also the exterior surfaces of films 102, 102B may carry sensing features. Electrical connections such as traces and control circuitry has been omitted from the figure for clarity reasons, but considerations provided hereinelsewhere regarding such are generally applicable also here. The sensing features 1002, 1006, 1010, 1012 may define at least portion of e.g. capacitive such as self-capacitive or mutual capacitive sensing, or inductive sensing.

One, still merely exemplary, application area of the above sensing arrangement could involve a controller device such as a steering wheel or other user input/user interface device of a vehicle, where one side thereof could be equipped with touch sensors or with a trackpad, and the opposite side with similar or different sensing arrangements.

For example, from the standpoint of a user, so-called front side facing the user could have definite meanings for purposes such as menu scrolling, application browsing and/or selection thereof. The backside sensor(s) such as trackpad could be more universal with no pre-defined fixed operation. Still, in some embodiments a backside sensor could be operable (or associated with any target function) only after a selected front side sensor has been activated (e.g. constant input such as finger press type requisite for accepting back side input).

Figure 11:
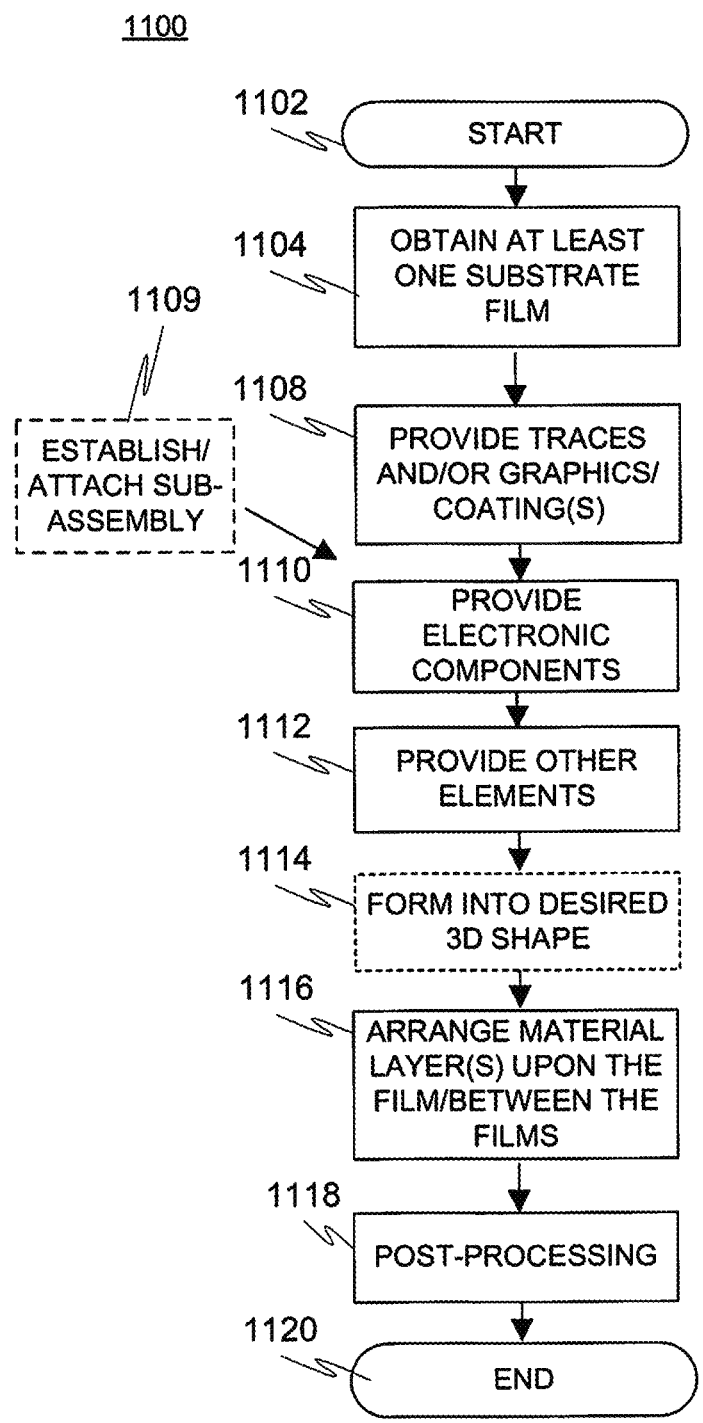
FIG. 11 illustrates a flow diagram in accordance with an embodiment of a method of the present invention.

FIG. 11 illustrates, at 1100, a flow diagram in accordance with an embodiment of a method of the present invention.

At the beginning of the method for manufacturing the multilayer structure, a start-up phase 1102 may be executed.

During start-up, the necessary tasks such as material, component and tools selection, acquisition, calibration and other configuration tasks may take place. Specific care must be taken that the individual elements and material selections work together and survive the selected manufacturing and installation processes, which is naturally preferably checked up-front on the basis of the manufacturing process specifications and component data sheets, or by investigating and testing the produced prototypes, for example.

The used equipment such as molding/IMD (in-mold decoration), lamination, bonding, (thermo)forming, casting, electronics assembly, peeling, cutting, drilling and/or printing equipment, among others, may be thus ramped up to operational status at this stage and tested, for example.

At 1104, at least one, optionally at least partially flexible, substrate film comprising e.g. plastics and/or other material(s) as discussed hereinbefore for accommodating a number of features, e.g. electronics such as sensing electrodes, optionally related circuitry, sensing response—adapting features such as one or more additional electrodes, shields, field shapers, etc. and/or other features, such as graphics, material layers, optical elements, etc. is obtained. The substrate film may initially be substantially planar or e.g. curved.

A ready-made element, e.g. a roll or sheet of plastic film, may be in some embodiments acquired for use as the substrate material. In some embodiments the substrate film itself may be first produced or at least treated, optionally cut and/or coated, by molding or other methods from a number of selected starting material(s). Optionally, the substrate film may be processed further at this stage.

Items 1108-1114 have been disclosed separately and in certain order for clarity reasons but a person skilled in the art should easily apprehend the fact that depending on each particular use scenario, the mutual order of the items may be flexibly changed, they may be executed alternately and repeatedly, integrated together or split into smaller ensembles, for example. Yet, one or more items may be selectively omitted from the implementation.

Accordingly. item 1108 refers to provision of features such as conductive layers or areas defining e.g. a number of conductor lines (traces, defining e.g. at least part of a circuit design), electrodes and/or contact pads on the substrate film(s), on any or both sides thereof, preferably but not necessarily by one or more additive techniques of printed electronics technology, deposition, transfer lamination, etching, etc. For example, screen, inkjet, flexographic, gravure or offset lithographic printing may be utilized. Also further actions cultivating the film(s) involving e.g. coating or specifically plating, and/or printing, or generally provision, of decorative or informative graphics such as visual indicators thereon may take place now or e.g. after provision of further features such as electronic components to the film(s). A number of vias may be provided and filled with e.g. electrically conductive material(s) or generally feature(s), and/or a number of conductive features may be arranged through the film(s).

At 1110, a number of electronic components such as ready-made components, e.g. various SMDs, may be attached to target areas on the film(s) (conductors/contact areas/pads provided by e.g. printing at 1108, for example) e.g. by solder and/or adhesives. Alternatively or additionally, printed electronics and/or other feasible technology may be applied to actually manufacture at least part of the components, such as OLEDs, directly onto the film(s). Item 1109 refers to possible provision of sub-assemblies such as system-on-a-chip assembly on the film(s).

At 1112, a number of e.g. optical or other type of functional features may be provided by mounting or directly fabrication onto the substrate film(s).

At 1114, 3D forming, using e.g. thermoforming or cold forming, of the substrate film(s) may take place. As outcome, the concerned substrate film(s) shall exhibit a desired three-dimensional (essentially non-planar) shape. The substrate film(s) containing suitable, formable material may therefore be shaped to better fit the target environment/device and/or to better accommodate various features. Alternatively, forming could take place prior provision of at least some functional features such as electronics on the film(s) or e.g. after molding in case the already-established multilayer stack is designed to survive such processing.

At 1116, at least one material layer as contemplated hereinbefore, optionally comprising e.g. thermoplastic material, is arranged upon the substrate film(s) so as to cover e.g. one or more (first) functional features already provided thereon. As mentioned earlier, e.g. molding, casting or further selected lamination techniques are generally applicable here. As also reviewed hereinearlier, several materials of different elasticity, permittivity and/or permeability may be provided to affect and adjust e.g. sensing characteristics such as sensitivity.

In practice, one or more substrate films or film layers may be used as an insert in an injection molding process, for instance. One side of the substrate film may be, at least in some embodiments, left free from the molded plastics.

In case e.g. two films/film layers are used, both of them may be inserted in their own mold halves so that the plastic layer is injected between them. Alternatively, the second and potential further films could be attached to an aggregate of the first film and plastic layer afterwards by suitable lamination technique.

Regarding the resulting overall thickness of the obtained stacked multilayer structure, it depends e.g. on the used materials and related minimum material thicknesses providing the necessary strength in view of the manufacturing and subsequent use. These aspects have to be considered on case-by-case basis. For example, the overall thickness of the structure could be about 1 mm or a few millimeters, but considerably thicker or thinner embodiments are also feasible.

In some embodiments, as discussed in connection with the description of FIG. 2, a single film could be folded or generally, bent so as to define multiple layers in the multilayer stack.

Item 1118 refers to provision of one or more additional features, such as various material layers, materials, components, internal connecting features (e.g. electrically conductive features between/through layer(s)), and/or connectors, in the structure. Further, various post-processing tasks may be executed at this stage. The additional layers may be provided to the multilayer structure by lamination or e.g. suitable coating (e.g. deposition) procedure. The layers may be of protective, indicative and/or aesthetic value (graphics, colors, figures, text, numeric data, etc.) and contain e.g. textile, leather or rubber materials instead of or in addition to plastics. Additional elements such as electronics may be installed at the outer surface(s) of the structure, such as the exterior surface of the substrate. The provided connector or connector cable type feature may be connected to a desired external connecting element such as external connector or connector cable of an external device, system or structure.

At 1120, method execution is ended.

The scope of the present invention is determined by the attached claims together with the equivalents thereof. A person skilled in the art will appreciate the fact that the disclosed embodiments were constructed mainly for illustrative purposes, and other arrangements applying many of the above principles could be readily prepared to best suit each potential use scenario.

The invention claimed is:

1. An integrated multilayer structure suitable for use in sensing applications, the multilayer structure comprising:
at least one plastic layer having a first side and a second side opposite the first side;
at least one film layer provided on both of the first and second sides of the at least one plastic layer;
the at least one film layer on the first side of the at least one plastic layer comprising electronics incorporating reactance sensing electronics for sensing of one or more selected target quantities or qualities and conversion thereof into representative electrical signals, the sensing electronics comprising at least one electrode and a galvanic connection element configured to connect the electrode to an associated control circuitry driving the at least one electrode; and
the at least one film layer on the second side of the at least one plastic layer comprising one or more features including at least one conductive feature, the one or more features being configured to shape an electromagnetic field to adapt a sensitivity or a directionality of a sensing response of the sensing electronics on the first side of the at least one plastic layer.

2. The multilayer structure of claim 1, wherein the at least one film layer on the first side of the at least one plastic layer comprises electrically insulating material, provided with conductive coating.

3. The multilayer structure of claim 1, wherein the sensing electronics comprises one or more electronic components disposed on the at least one film layer on the first side of the at least one plastic layer.

4. The multilayer structure of claim 1, wherein the at least one electrode of the sensing electronics defines at least one electrode pattern the elements of which being provided in one or more layers on one or opposing two sides of the at least one film layer on the first side of the at least one plastic layer.

5. The multilayer structure of claim 4, wherein the pattern comprises a mutual capacitance sensing pattern of a plurality of transmitter and receiver electrodes, or a self-capacitance sensing pattern of a plurality of sensing electrodes.

6. The multilayer structure of claim 1, wherein the at least one film layer on the first side comprises a first film and the at least one film layer on the second side comprises a second film.

7. The multilayer structure of claim 1, wherein the one or more features comprise at least one electrically conductive or insulating functional element locally defined by the material of a film of the at least one film layer on the second side of the at least one plastic layer.

8. The multilayer structure of claim 1, wherein the one or more features comprise conductive material constituting at least portion of a film of the at least one film layer on the second side of the at least one plastic layer.

9. The multilayer structure of claim 1, wherein the one or more features comprise at least one electrically or thermally conductive or insulating element defined by, additional conductive or insulating material provided on a film of the at least one film layer on the second side of the at least one plastic layer.

10. The multilayer structure of claim 9, wherein the element extends locally on the film.

11. The multilayer structure of claim 9, wherein the element extends over a major portion of or substantially whole surface of the film on at least one side thereof.

12. The multilayer structure of claim 1, wherein at least one of the one or more features comprises colored, conductive material on a film of the at least one film layer on the second side of the at least one molded plastic layer.

13. The multilayer structure of claim 1, wherein at least one of the one or more features is positioned adjacent a predefined sensing area or sensing volume established by at least one electrode and a further electrode or reference pattern provided in the structure, or positioned at least partially superimposed over a conductive trace of the sensing electronics, the at least one feature defining at least one functional element selected from the group consisting of:
an electromagnetic shield for shielding, the sensing area, sensing volume, or said trace from external or internal electromagnetic disturbances or interference; and
electromagnetic or electric field adjuster for adjusting sensitivity of the sensing volume.

14. The multilayer structure of claim 1, wherein the sensing electronics and the one or more features define one or more sensing areas or volumes on both sides of the at least one plastic layer and the structure further comprises an intermediate film within the at least one plastic layer, said intermediate film being at least partially made of or provided with conductive material defining an electromagnetic shield or a grounding layer to reduce mutual electromagnetic interference between the sensing functions of both sides.

15. The multilayer structure of claim 1, wherein the one or more features define at least one element selected from the group consisting of: electrode or electrode pattern configured to establish a mutual capacitance sensing arrangement with the at least one electrode of the sensing electronics, electrode or electrode pattern on a side of a film of said at least one film layer on the second side of the at least one plastic layer that faces the at least one plastic layer and configured to establish a mutual capacitance sensing arrangement with the at least one electrode of the sensing electronics, touch or contactless sensing region, Non-Conductive Vacuum Metallization (NCVM) coating, electroless plating based coating, Physical Vapor Deposition (PVD) coating, capacitively coupled electromagnetic or electric field adjuster, parasitic coupling based sensing feature, reference electrode, actively or passively coupled reference plate, ground electrode, and floating ground, earthed, or circuit ground connected ground electrode.

16. The multilayer structure of claim 1, wherein the at least one plastic layer comprises a volume of elastic material provided locally upon the at least one electrode of the sensing electronics or below a predefined sensing region on the at least one film layer on the second side of the at least one plastic layer, the volume being configured to compress responsive to an external three subjected thereto through said at least one film layer of the first side of the at least one plastic layer.

17. The multilayer structure of claim 1, comprising a galvanic connection element between the sensing electronics and the one or more features.

18. The multilayer structure of claim 1, further comprising at least one protective or decorative overlay layer upon the at least one film layer on the second side of the at least one plastic layer, wherein the overlay layer comprises at least one material selected from the group consisting of: veneer, wood, textile, fabric, biological natural material, molded material, injection molded material, and plastics.

19. An integrated multilayer structure suitable for use in sensing applications, the multilayer structure comprising:
   at least one plastic layer having a first side and a second side opposite the first side;
   at least one film layer provided on both of the first and second sides of the at least one plastic layer; the at least one film layer on the first side of the at least one plastic layer comprising electronics incorporating reactance sensing electronics for sensing of one or more selected target quantities or qualities and conversion thereof into representative electrical signals, the sensing electronics comprising at least one electrode and a galvanic connection element configured to connect the electrode to an associated control circuitry driving the at least one electrode; and the at least one film layer on the second side of the at least one plastic layer comprising one or more features including at least one conductive feature, the one or more features being configured to shape an electromagnetic field to adapt a sensitivity or a directionality of a sensing response of the sensing electronics on the first side of the at least one plastic layer; and a film, first section of which defines at least portion of the at least one film layer on the first side of the at least one plastic layer and second section of which defines at least portion of the at least one film layer on the second side of the at least one plastic layer, wherein the first and second sections are connected by a third section extending between the first and second sections.

20. A method for manufacturing an integrated multilayer structure for sensing applications, comprising:
   obtaining a film;
   arranging the film with reactance sensing electronics for sensing of one or more selected target quantities or qualities on a surface of the film, and conversion thereof into representative electrical signals, the sensing electronics comprising at least one electrode and a galvanic connection element connecting the at least one electrode to an associated control circuitry driving the at least one electrode;
   arranging the film with one or more features including a conductive feature on the surface of the film, the one or more features being configured to shape an electromagnetic field to adapt a sensitivity or a directionality of the sensing response of the sensing, electronics; and
   arranging and configuring at least one plastic layer relative to the film so that the at least one plastic layer defines an integrated, intermediate layer between the sensing electronics and the one or more features hosted by the film.

* * * * *

UNITED STATES PATENT AND TRADEMARK OFFICE
CERTIFICATE OF CORRECTION

PATENT NO. : 10,485,094 B1
APPLICATION NO. : 16/113198
DATED : November 19, 2019
INVENTOR(S) : Isohatala et al.

It is certified that error appears in the above-identified patent and that said Letters Patent is hereby corrected as shown below:

In the Claims

Claim 16, Column 31, Line 28, delete the word "three" and insert the word --force--;

Claim 20, Column 32, Line 40, delete the "," appearing between "sensing" and "electronics".

Signed and Sealed this
Twenty-seventh Day of September, 2022

*Katherine Kelly Vidal*

Katherine Kelly Vidal
*Director of the United States Patent and Trademark Office*